US012615839B2

(12) United States Patent
Nishi et al.

(10) Patent No.: US 12,615,839 B2
(45) Date of Patent: Apr. 28, 2026

(54) SEMICONDUCTOR DEVICE AND METHOD FOR MANUFACTURING THE SAME

(71) Applicant: Mitsubishi Electric Corporation, Tokyo (JP)

(72) Inventors: Koichi Nishi, Tokyo (JP); Koji Tanaka, Tokyo (JP); Shinya Soneda, Tokyo (JP); Shigeto Honda, Tokyo (JP); Naoyuki Takeda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 627 days.

(21) Appl. No.: 17/819,809

(22) Filed: Aug. 15, 2022

(65) Prior Publication Data

US 2023/0131163 A1 Apr. 27, 2023

(30) Foreign Application Priority Data

Oct. 26, 2021 (JP) ................................. 2021-174564

(51) Int. Cl.
| | |
|---|---|
| *H10D 84/60* | (2025.01) |
| *H01L 21/24* | (2006.01) |
| *H01L 21/265* | (2006.01) |
| *H01L 21/266* | (2006.01) |
| *H10D 8/00* | (2025.01) |
| *H10D 12/00* | (2025.01) |
| *H10D 12/01* | (2025.01) |
| *H10P 30/20* | (2026.01) |
| *H10P 30/22* | (2026.01) |
| *H10P 95/00* | (2026.01) |

(52) U.S. Cl.
CPC ........... *H10D 84/617* (2025.01); *H10D 8/422* (2025.01); *H10D 12/038* (2025.01); *H10D 12/481* (2025.01); *H10P 30/204* (2026.01); *H10P 30/21* (2026.01); *H10P 30/22* (2026.01); *H10P 95/50* (2026.01)

(58) Field of Classification Search
None
See application file for complete search history.

(56) References Cited

U.S. PATENT DOCUMENTS

| | | | |
|---|---|---|---|
| 8,742,454 B2 | 6/2014 | Iwasaki | |
| 2003/0173584 A1* | 9/2003 | Nikaido | ............ H01L 21/28575 257/E29.127 |

(Continued)

FOREIGN PATENT DOCUMENTS

| | | |
|---|---|---|
| JP | 2009-124049 A | 6/2009 |
| JP | 2011-023527 A | 2/2011 |
| JP | 5724887 B2 | 5/2015 |

*Primary Examiner* — Jessica S Manno
*Assistant Examiner* — Christopher A. Schodde
(74) *Attorney, Agent, or Firm* — Studebaker Brackett PLLC

(57) ABSTRACT

A semiconductor device includes a first electrode and a second electrode. The first electrode is connected to a collector layer and a first portion on the collector layer side of a cathode layer. The second electrode is connected to a second portion of the cathode layer excluding the first portion. A work function of the first electrode is larger than a work function of the second electrode, and one of the first electrode and the second electrode and the semiconductor substrate sandwich another of the first electrode and the second electrode in a thickness direction of the semiconductor substrate.

10 Claims, 29 Drawing Sheets

(56) References Cited

U.S. PATENT DOCUMENTS

| | | | |
|---|---|---|---|
| 2010/0270587 A1* | 10/2010 | Rahimo | ............... H10D 64/231 |
| | | | 257/140 |
| 2010/0327313 A1* | 12/2010 | Nakamura | ........... H10D 62/142 |
| | | | 257/133 |
| 2011/0012171 A1 | 1/2011 | Kobayashi | |
| 2011/0147814 A1* | 6/2011 | Yamasaki | .............. H10D 64/62 |
| | | | 257/288 |
| 2013/0181254 A1* | 7/2013 | Iwasaki | ................ H10D 12/411 |
| | | | 257/140 |
| 2017/0345817 A1* | 11/2017 | Nishimura | .............. H01L 23/52 |
| 2018/0083123 A1* | 3/2018 | Ye | ...................... H01L 21/32139 |
| 2019/0181136 A1* | 6/2019 | Niwa | ...................... H10D 62/60 |
| 2019/0206860 A1* | 7/2019 | Kamimura | ........... H10D 84/038 |
| 2021/0265491 A1* | 8/2021 | Soneda | ............... H10D 12/481 |
| 2022/0406922 A1* | 12/2022 | Hauf | ................... H10D 12/481 |

* cited by examiner

F I G. 3
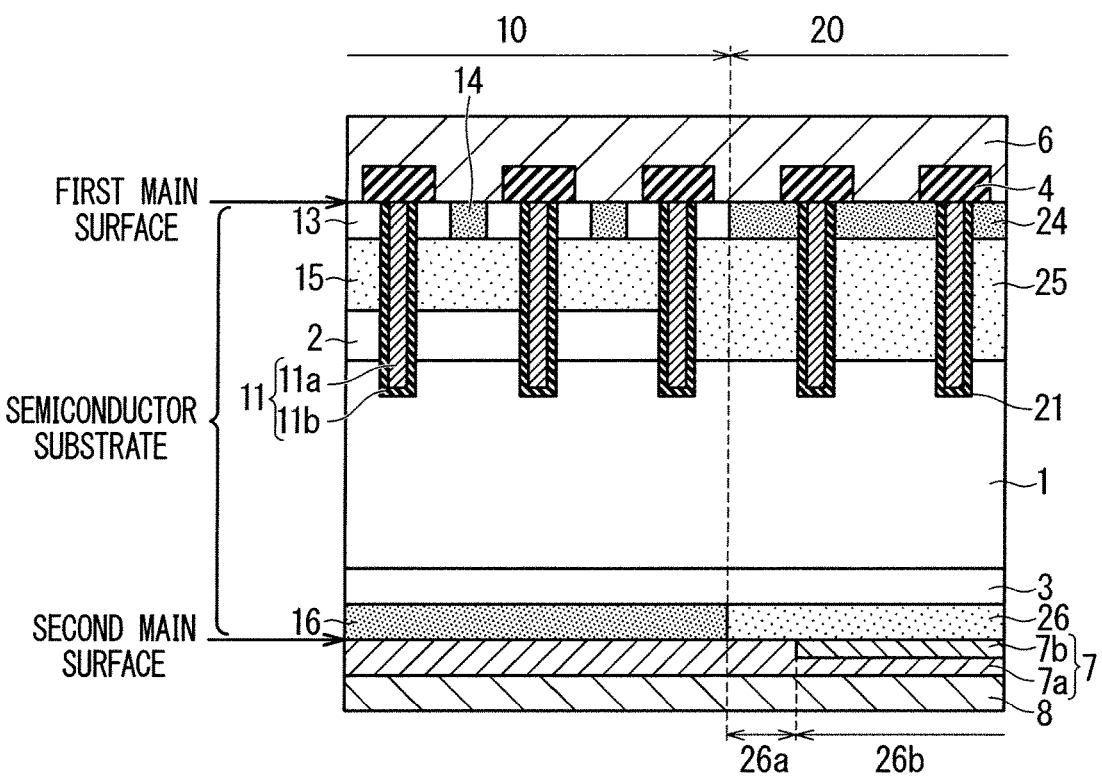
F I G. 4
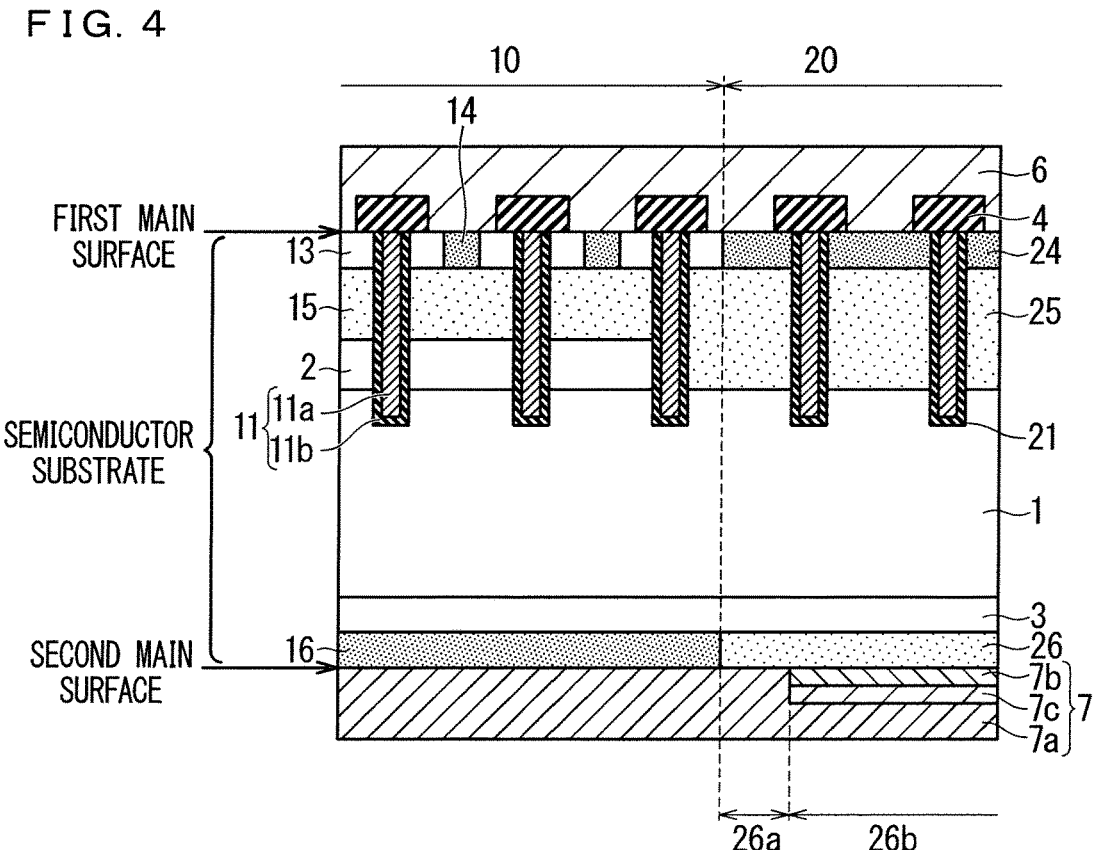

F I G. 7
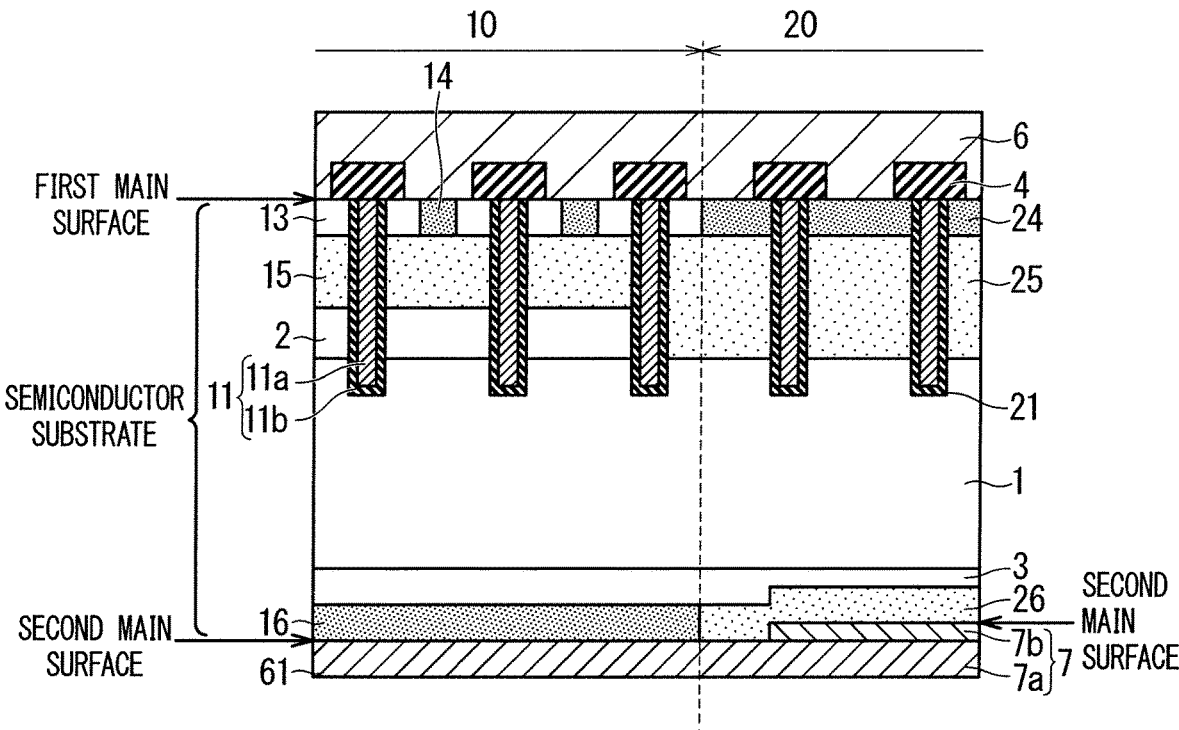
F I G. 8
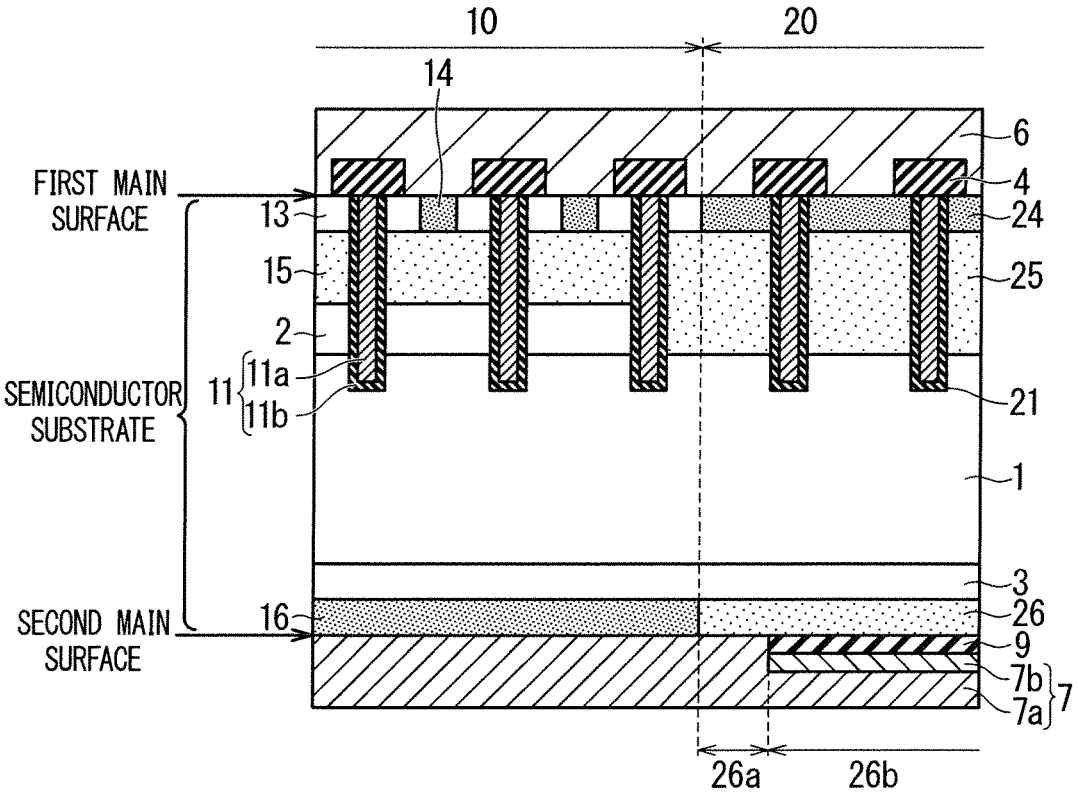

FIG. 9

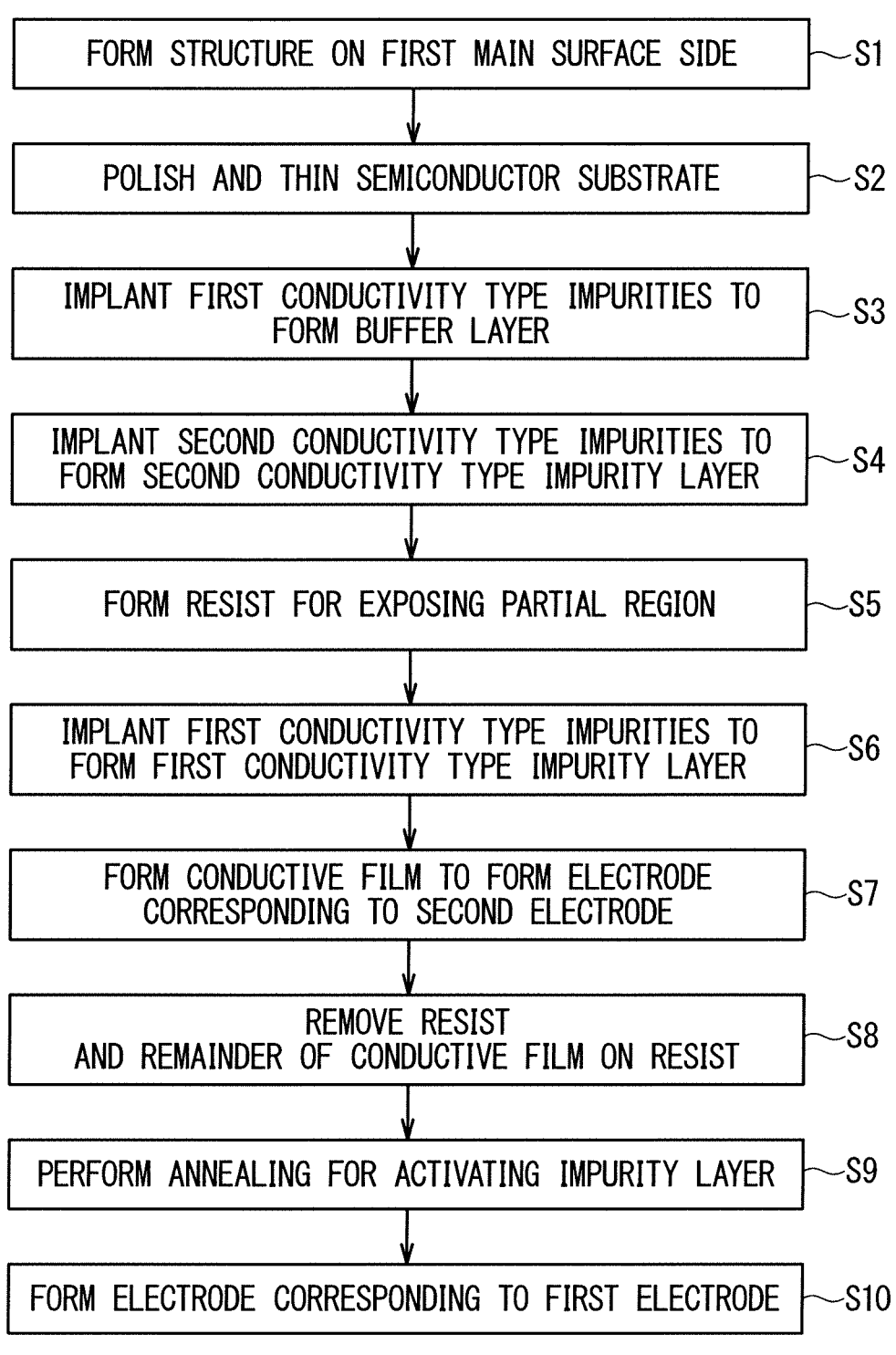

FORM STRUCTURE ON FIRST MAIN SURFACE SIDE — S1

POLISH AND THIN SEMICONDUCTOR SUBSTRATE — S2

IMPLANT FIRST CONDUCTIVITY TYPE IMPURITIES TO FORM BUFFER LAYER — S3

IMPLANT SECOND CONDUCTIVITY TYPE IMPURITIES TO FORM SECOND CONDUCTIVITY TYPE IMPURITY LAYER — S4

FORM RESIST FOR EXPOSING PARTIAL REGION — S5

IMPLANT FIRST CONDUCTIVITY TYPE IMPURITIES TO FORM FIRST CONDUCTIVITY TYPE IMPURITY LAYER — S6

FORM CONDUCTIVE FILM TO FORM ELECTRODE CORRESPONDING TO SECOND ELECTRODE — S7

REMOVE RESIST AND REMAINDER OF CONDUCTIVE FILM ON RESIST — S8

PERFORM ANNEALING FOR ACTIVATING IMPURITY LAYER — S9

FORM ELECTRODE CORRESPONDING TO FIRST ELECTRODE — S10

F I G. 1 0
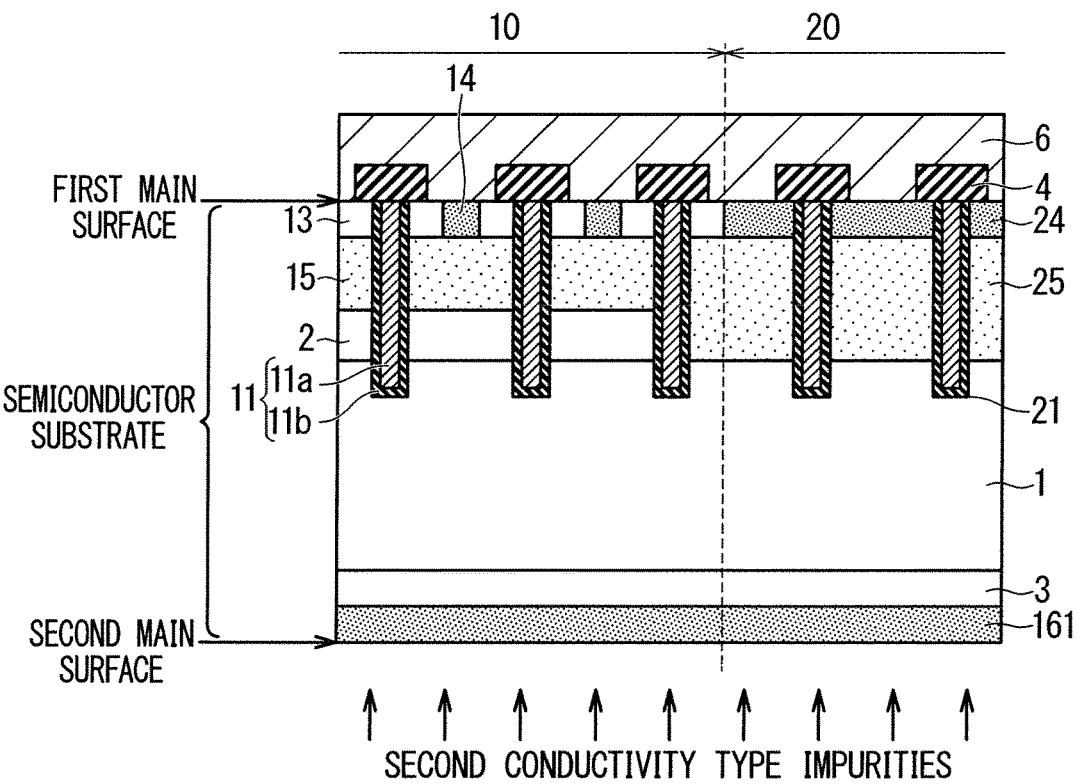
SECOND  CONDUCTIVITY  TYPE  IMPURITIES
F I G. 1 1
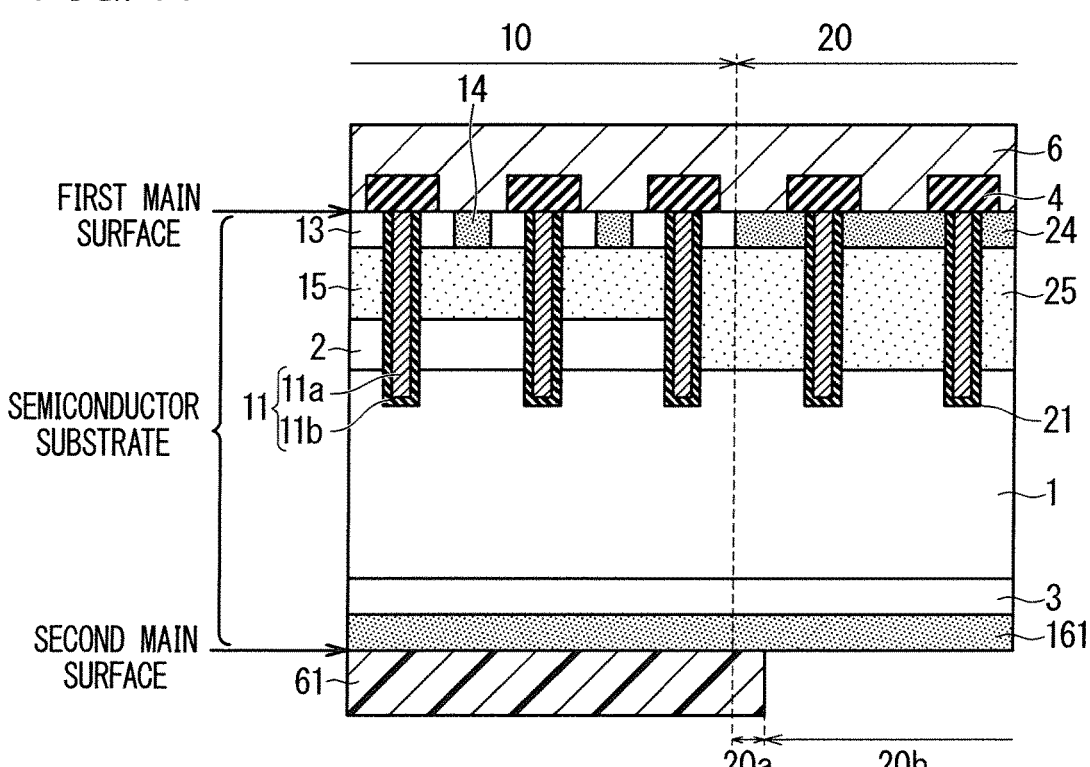

FIRST MAIN
SURFACE

SEMICONDUCTOR
SUBSTRATE

SECOND MAIN
SURFACE

FIRST CONDUCTIVITY TYPE IMPURITIES

FIRST MAIN
SURFACE

SEMICONDUCTOR
SUBSTRATE

SECOND MAIN
SURFACE

F I G. 16
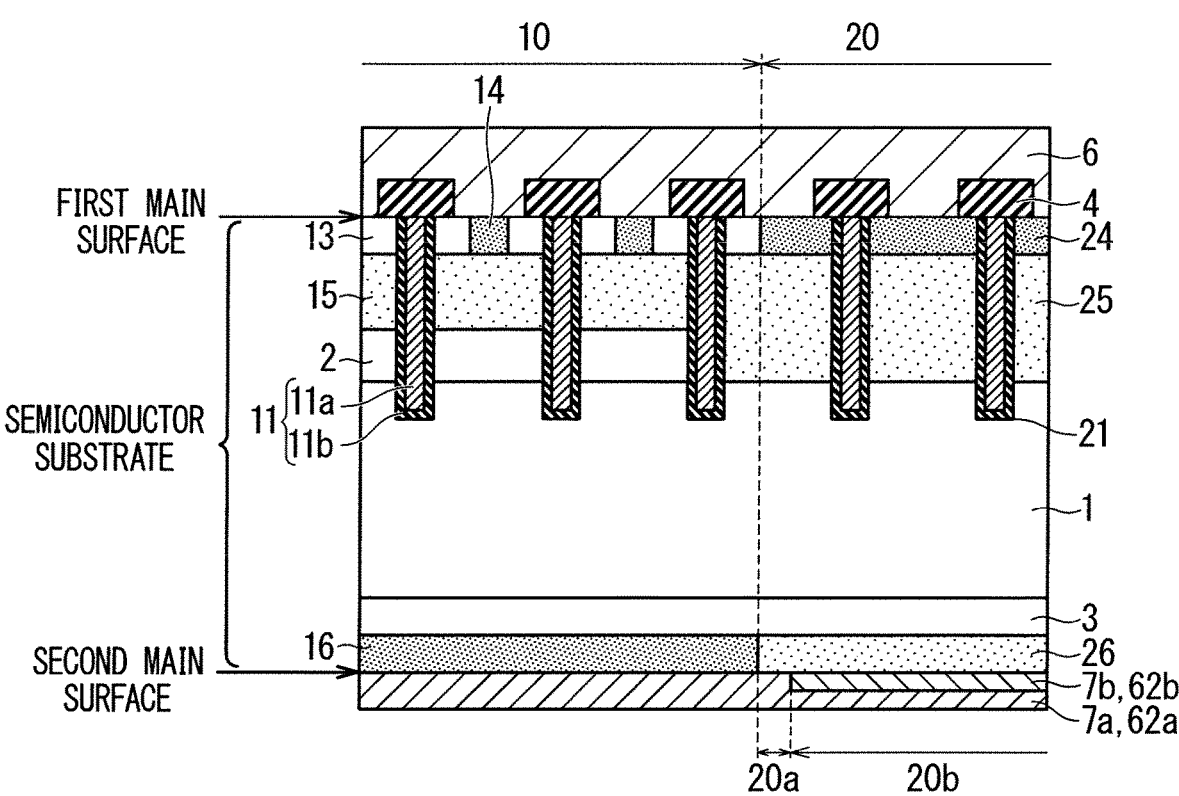

F I G. 17

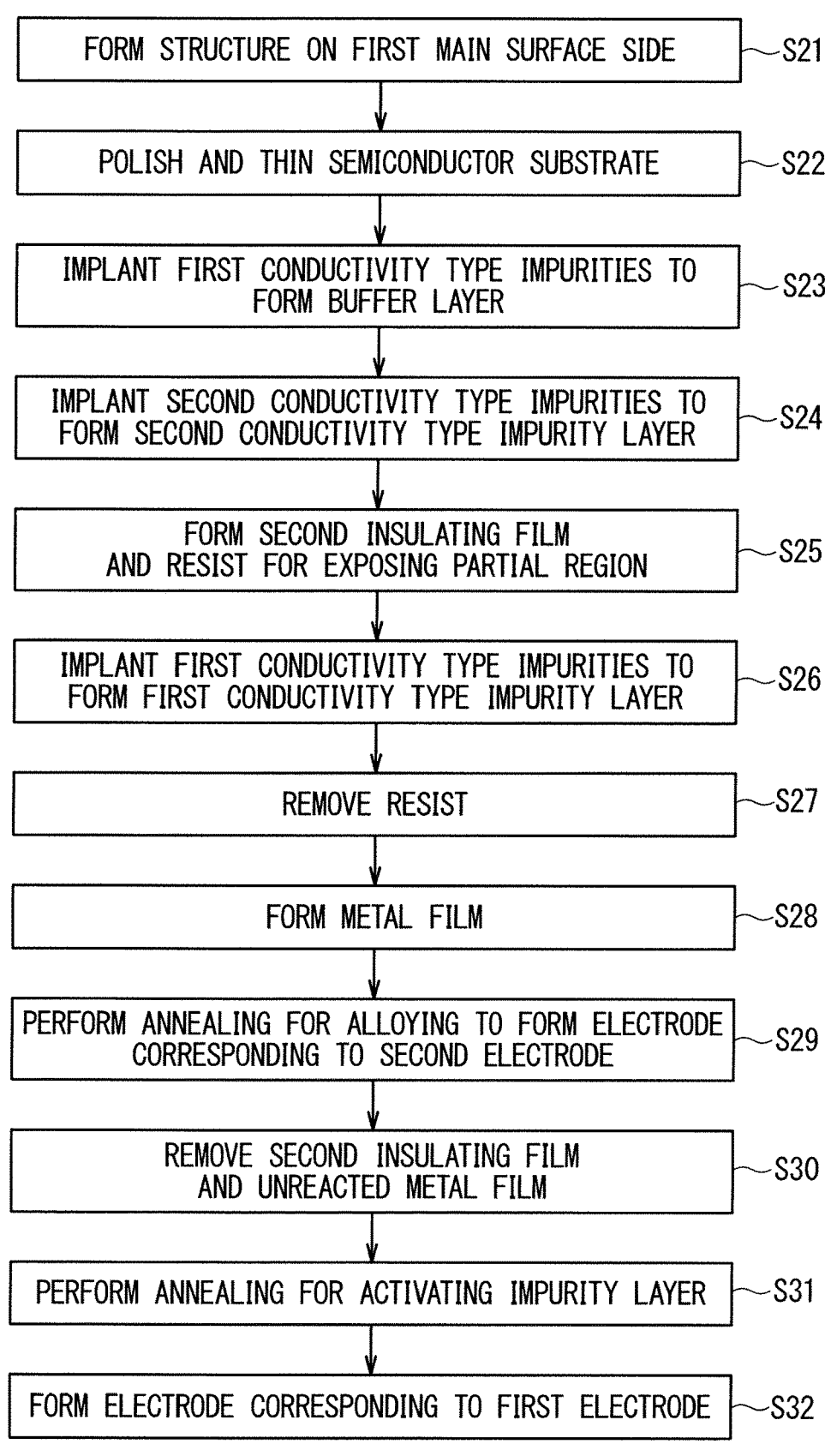

FORM STRUCTURE ON FIRST MAIN SURFACE SIDE — S21

POLISH AND THIN SEMICONDUCTOR SUBSTRATE — S22

IMPLANT FIRST CONDUCTIVITY TYPE IMPURITIES TO FORM BUFFER LAYER — S23

IMPLANT SECOND CONDUCTIVITY TYPE IMPURITIES TO FORM SECOND CONDUCTIVITY TYPE IMPURITY LAYER — S24

FORM SECOND INSULATING FILM AND RESIST FOR EXPOSING PARTIAL REGION — S25

IMPLANT FIRST CONDUCTIVITY TYPE IMPURITIES TO FORM FIRST CONDUCTIVITY TYPE IMPURITY LAYER — S26

REMOVE RESIST — S27

FORM METAL FILM — S28

PERFORM ANNEALING FOR ALLOYING TO FORM ELECTRODE CORRESPONDING TO SECOND ELECTRODE — S29

REMOVE SECOND INSULATING FILM AND UNREACTED METAL FILM — S30

PERFORM ANNEALING FOR ACTIVATING IMPURITY LAYER — S31

FORM ELECTRODE CORRESPONDING TO FIRST ELECTRODE — S32

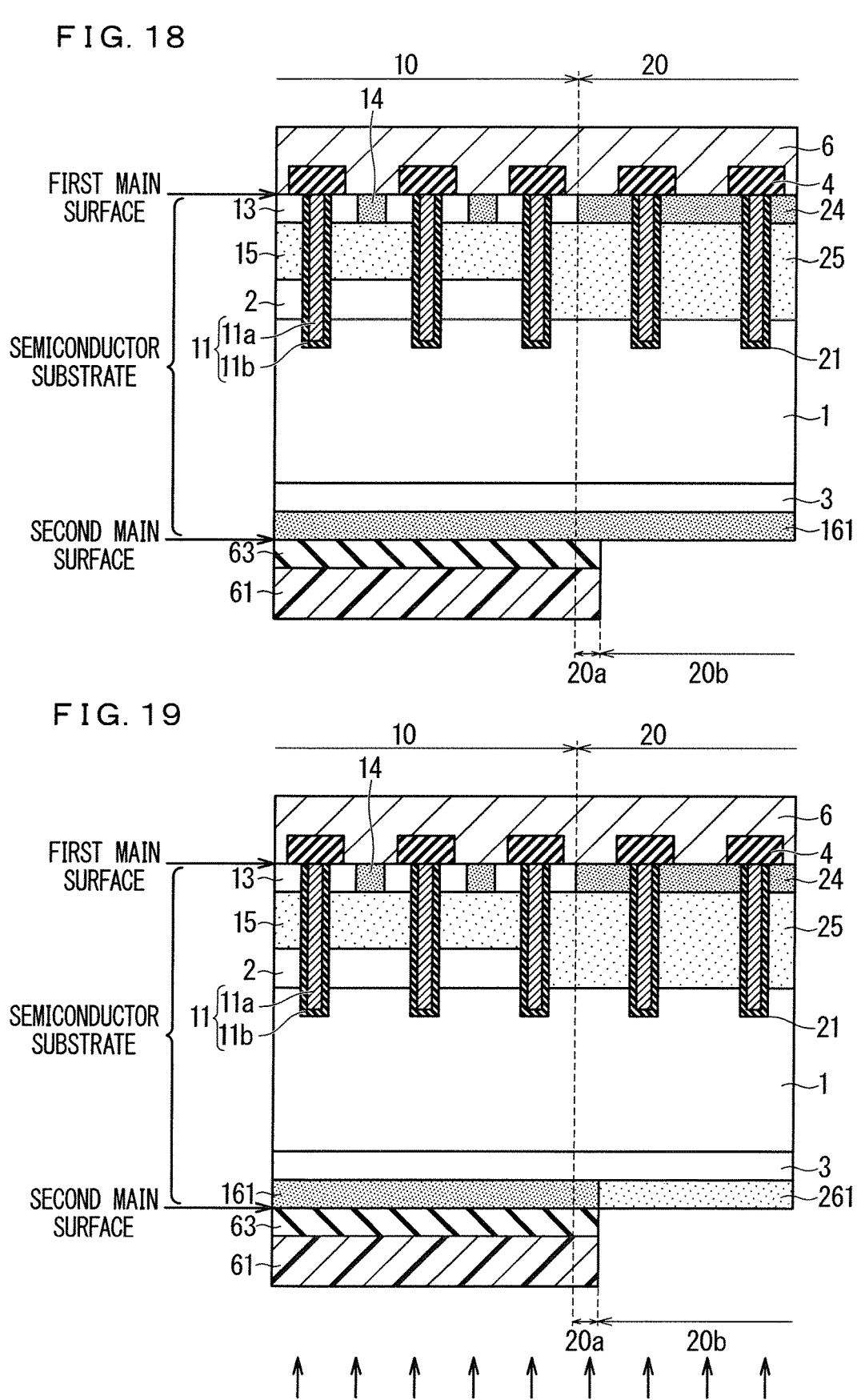
F I G. 18
F I G. 19
FIRST CONDUCTIVITY TYPE IMPURITIES

F I G. 2 2
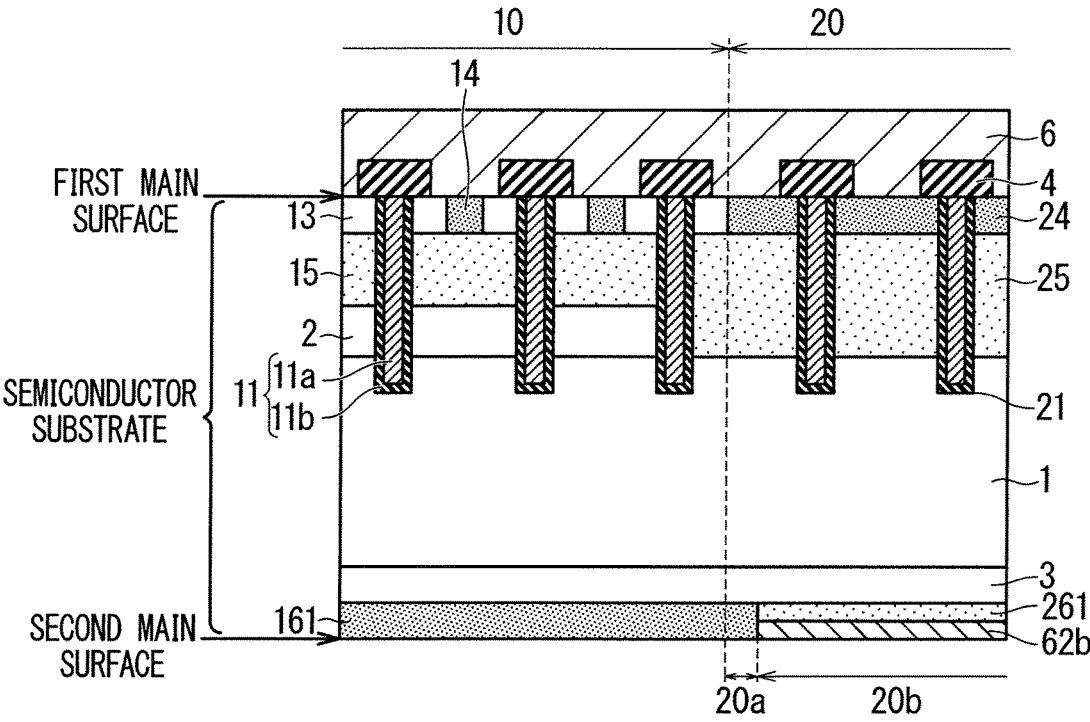
F I G. 2 3
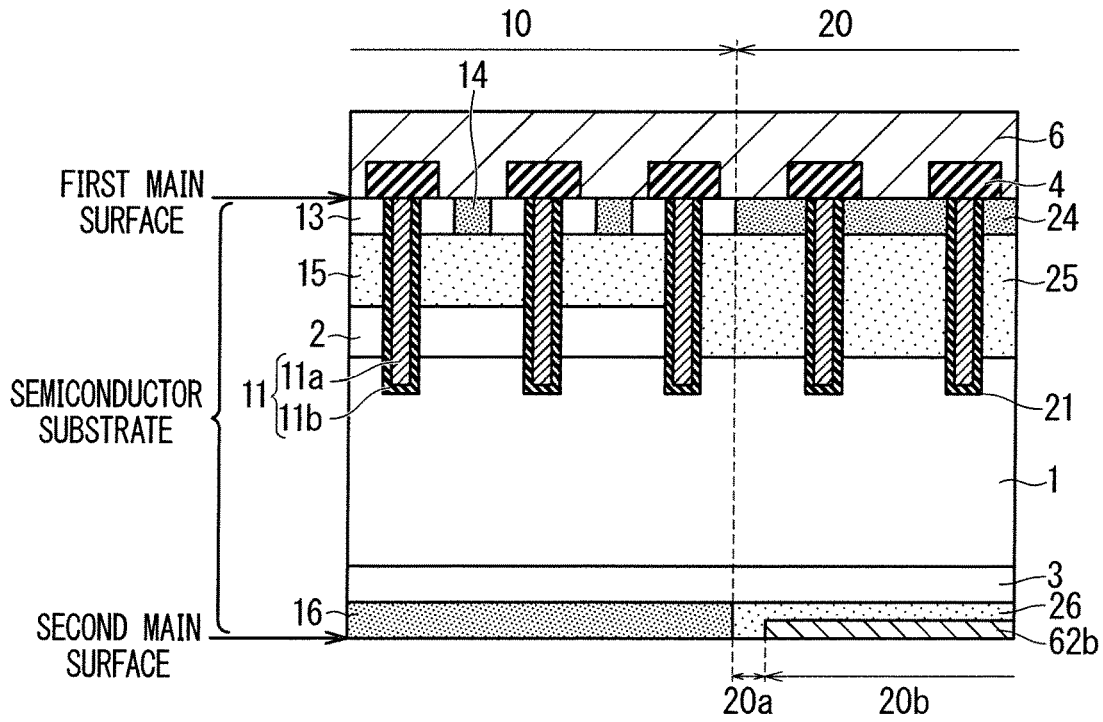

F I G. 2 5

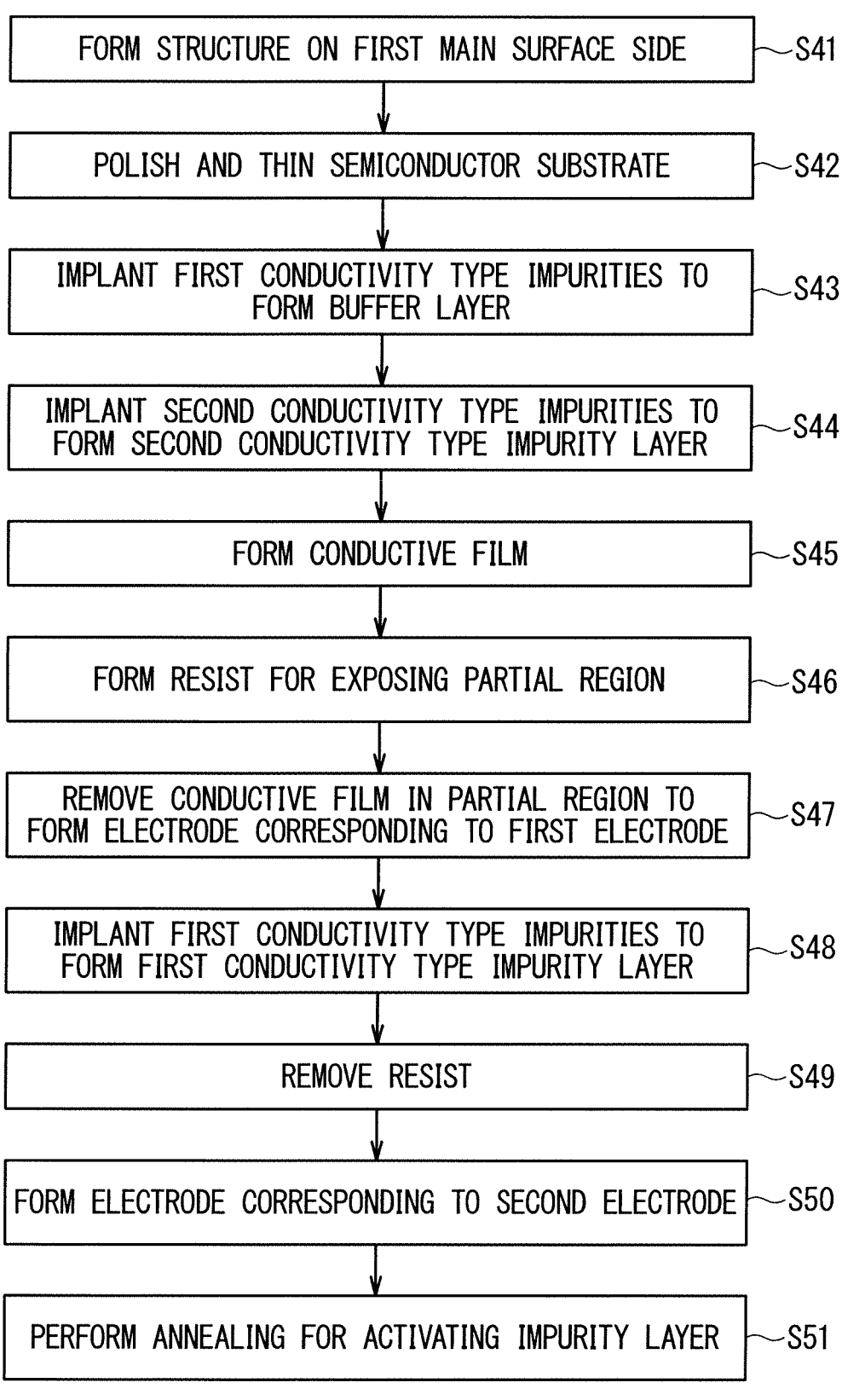

FORM STRUCTURE ON FIRST MAIN SURFACE SIDE — S41

POLISH AND THIN SEMICONDUCTOR SUBSTRATE — S42

IMPLANT FIRST CONDUCTIVITY TYPE IMPURITIES TO FORM BUFFER LAYER — S43

IMPLANT SECOND CONDUCTIVITY TYPE IMPURITIES TO FORM SECOND CONDUCTIVITY TYPE IMPURITY LAYER — S44

FORM CONDUCTIVE FILM — S45

FORM RESIST FOR EXPOSING PARTIAL REGION — S46

REMOVE CONDUCTIVE FILM IN PARTIAL REGION TO FORM ELECTRODE CORRESPONDING TO FIRST ELECTRODE — S47

IMPLANT FIRST CONDUCTIVITY TYPE IMPURITIES TO FORM FIRST CONDUCTIVITY TYPE IMPURITY LAYER — S48

REMOVE RESIST — S49

FORM ELECTRODE CORRESPONDING TO SECOND ELECTRODE — S50

PERFORM ANNEALING FOR ACTIVATING IMPURITY LAYER — S51

F I G. 2 8
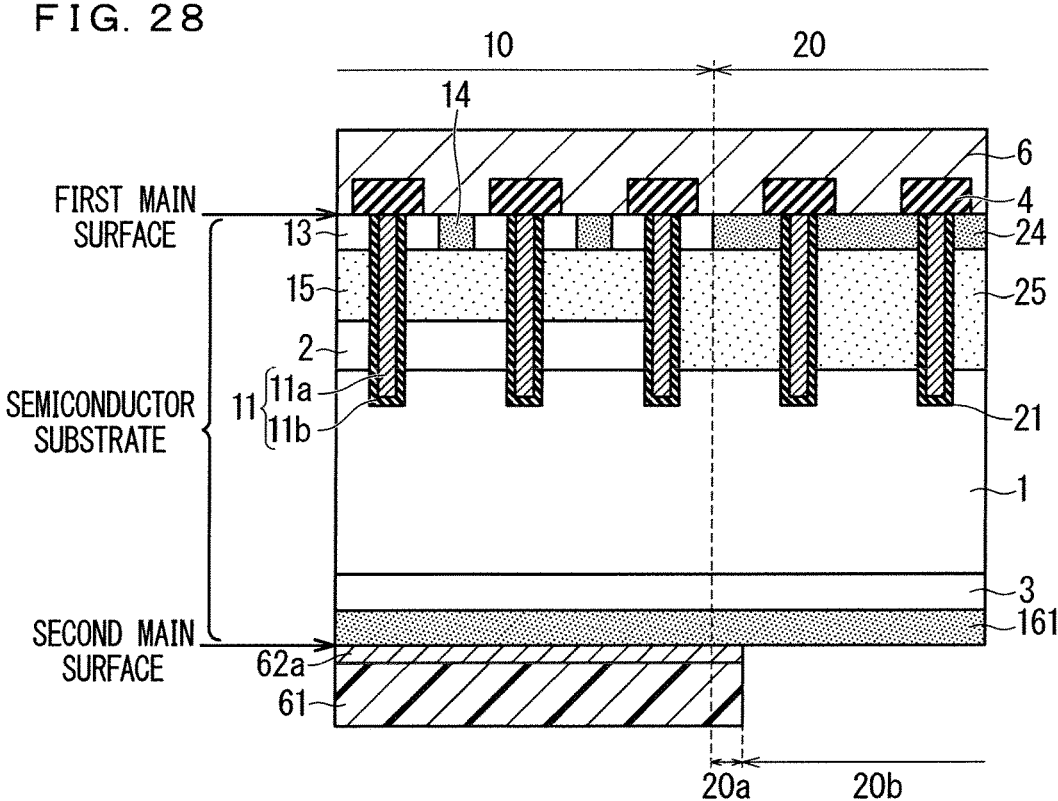
F I G. 2 9
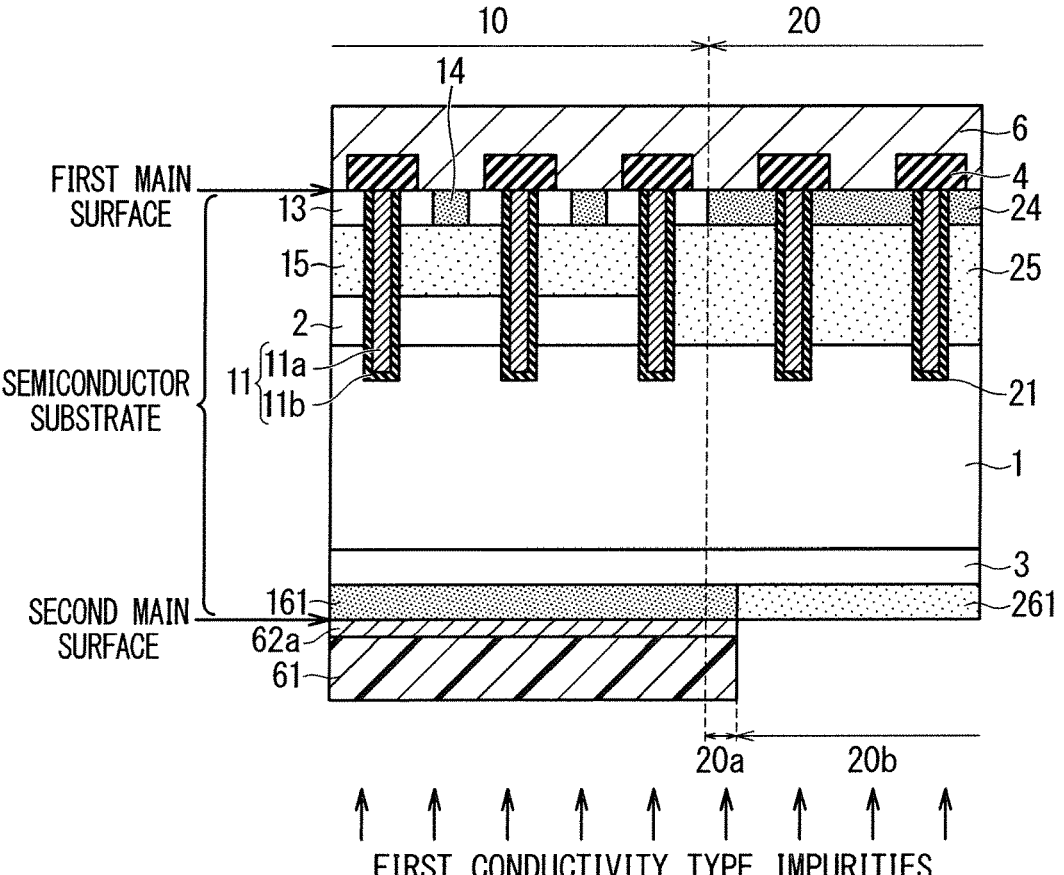
FIRST CONDUCTIVITY TYPE IMPURITIES

F I G . 3 0
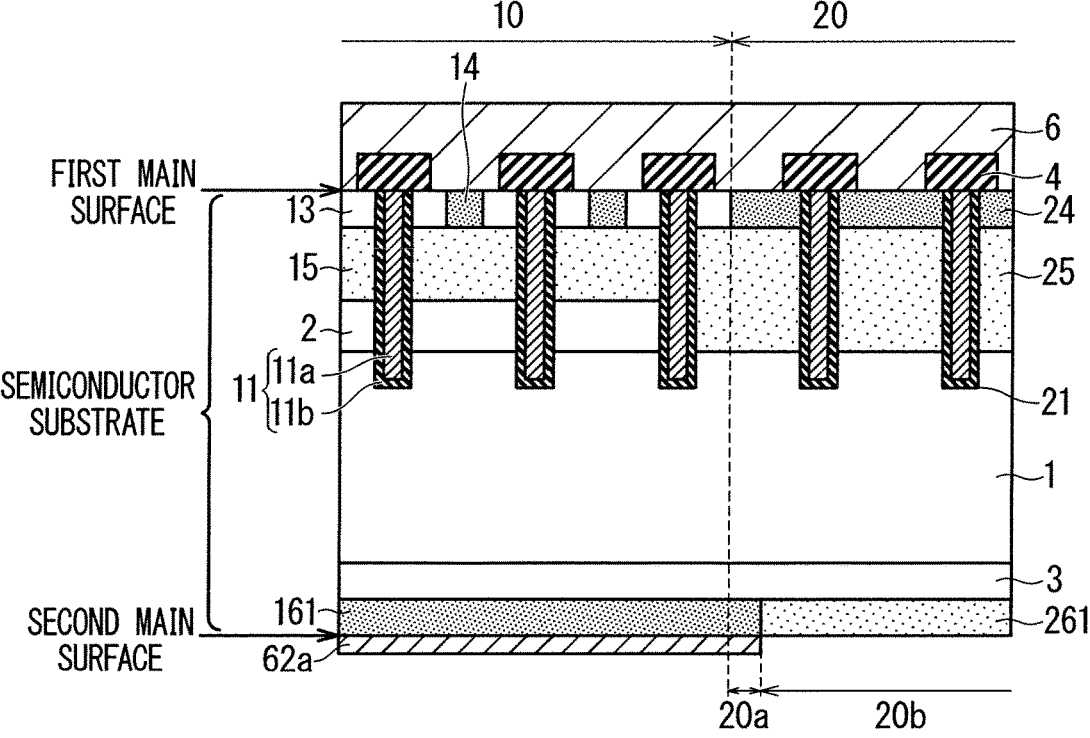
F I G . 3 1
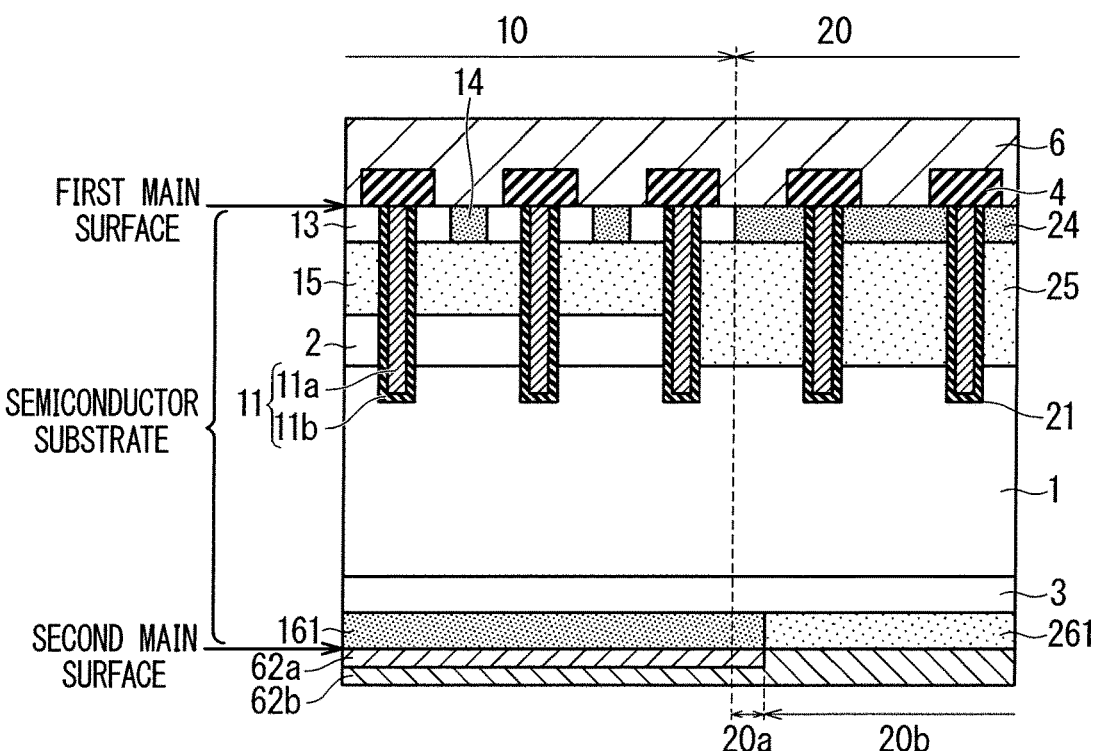

F I G .  3 3

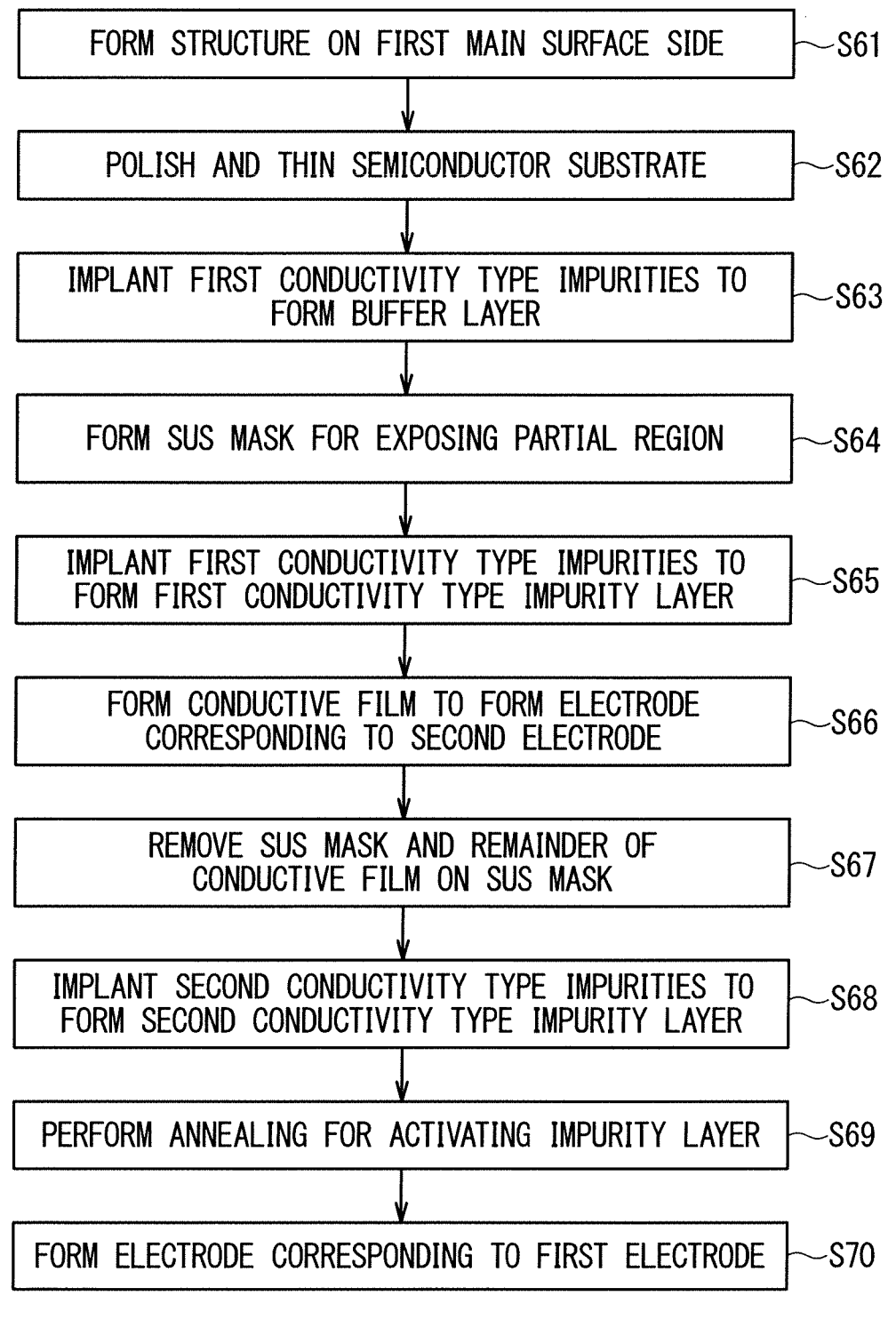

FORM STRUCTURE ON FIRST MAIN SURFACE SIDE ——S61

POLISH AND THIN SEMICONDUCTOR SUBSTRATE ——S62

IMPLANT FIRST CONDUCTIVITY TYPE IMPURITIES TO FORM BUFFER LAYER ——S63

FORM SUS MASK FOR EXPOSING PARTIAL REGION ——S64

IMPLANT FIRST CONDUCTIVITY TYPE IMPURITIES TO FORM FIRST CONDUCTIVITY TYPE IMPURITY LAYER ——S65

FORM CONDUCTIVE FILM TO FORM ELECTRODE CORRESPONDING TO SECOND ELECTRODE ——S66

REMOVE SUS MASK AND REMAINDER OF CONDUCTIVE FILM ON SUS MASK ——S67

IMPLANT SECOND CONDUCTIVITY TYPE IMPURITIES TO FORM SECOND CONDUCTIVITY TYPE IMPURITY LAYER ——S68

PERFORM ANNEALING FOR ACTIVATING IMPURITY LAYER ——S69

FORM ELECTRODE CORRESPONDING TO FIRST ELECTRODE ——S70

F I G. 34
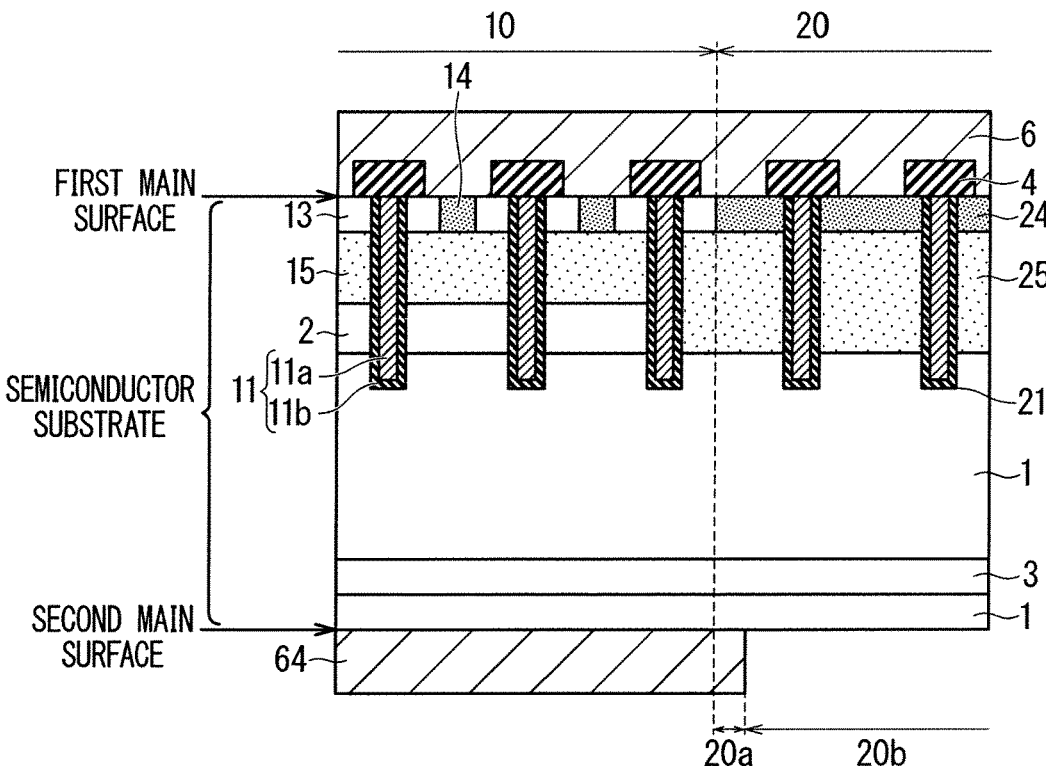
F I G. 35
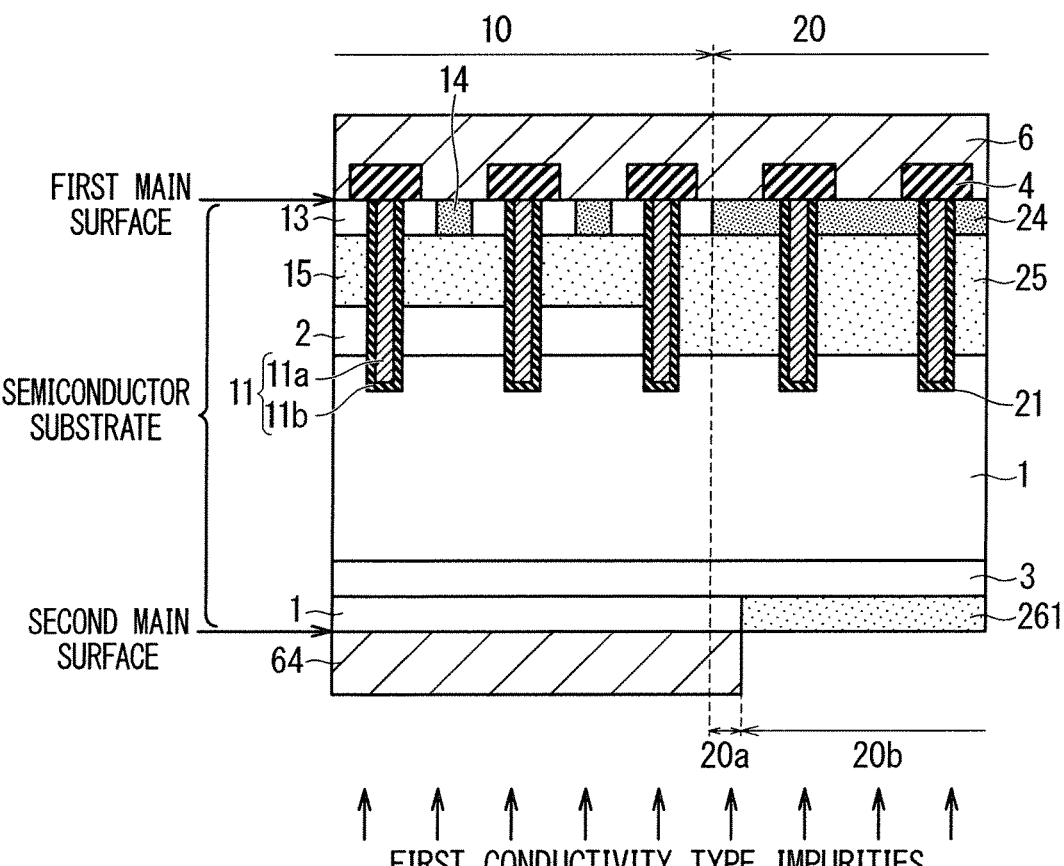

F I G. 3 8
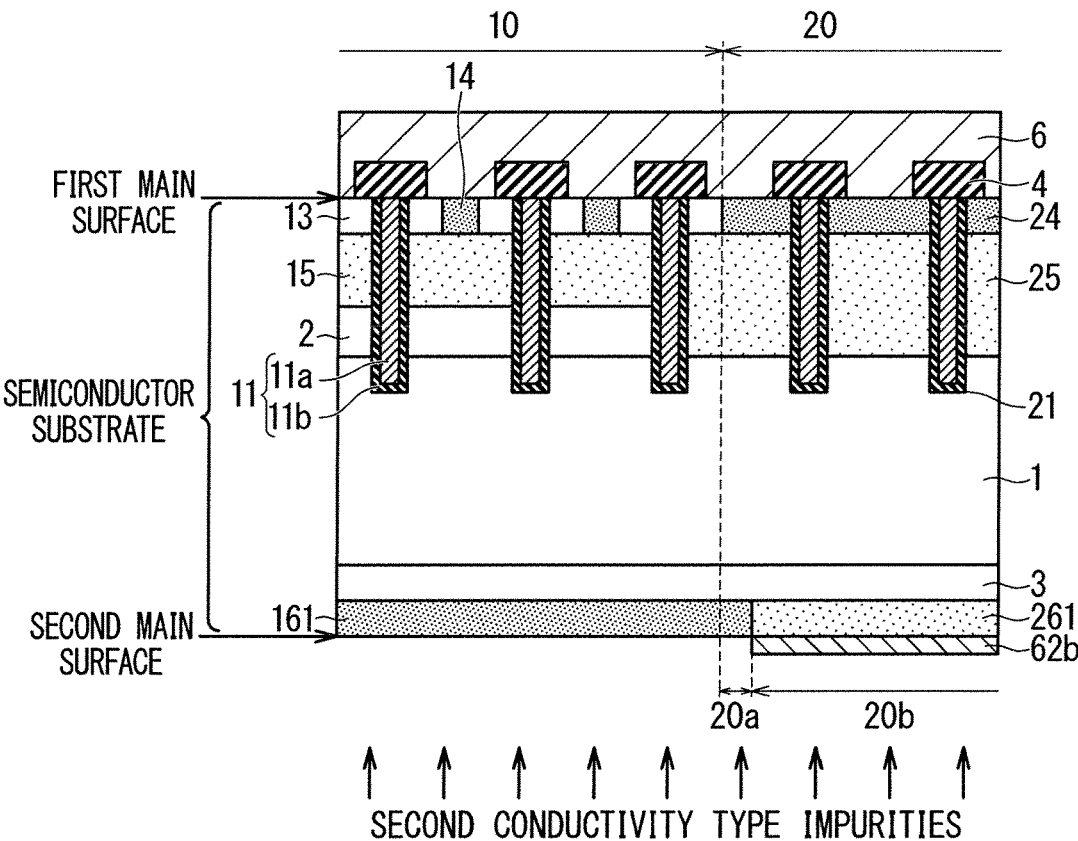
SECOND CONDUCTIVITY TYPE IMPURITIES
F I G. 3 9
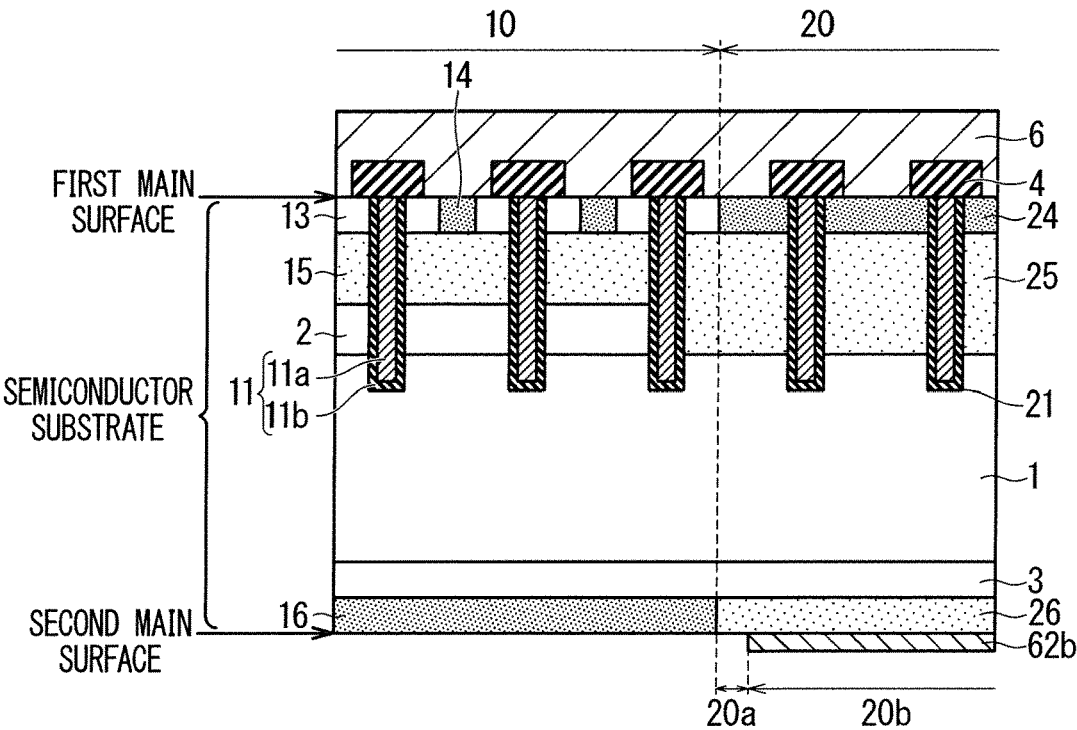

FIG. 41

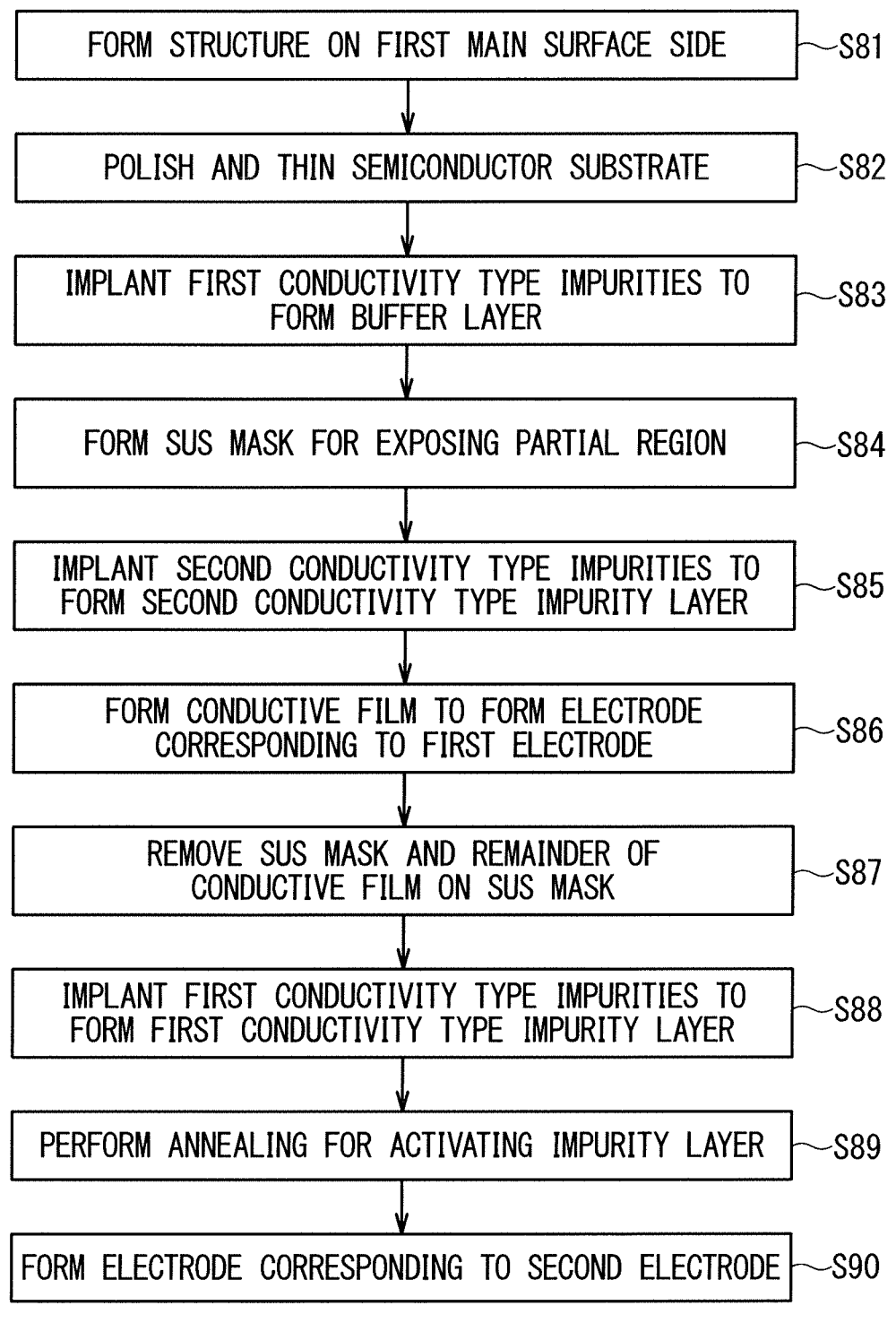

FORM STRUCTURE ON FIRST MAIN SURFACE SIDE — S81

POLISH AND THIN SEMICONDUCTOR SUBSTRATE — S82

IMPLANT FIRST CONDUCTIVITY TYPE IMPURITIES TO FORM BUFFER LAYER — S83

FORM SUS MASK FOR EXPOSING PARTIAL REGION — S84

IMPLANT SECOND CONDUCTIVITY TYPE IMPURITIES TO FORM SECOND CONDUCTIVITY TYPE IMPURITY LAYER — S85

FORM CONDUCTIVE FILM TO FORM ELECTRODE CORRESPONDING TO FIRST ELECTRODE — S86

REMOVE SUS MASK AND REMAINDER OF CONDUCTIVE FILM ON SUS MASK — S87

IMPLANT FIRST CONDUCTIVITY TYPE IMPURITIES TO FORM FIRST CONDUCTIVITY TYPE IMPURITY LAYER — S88

PERFORM ANNEALING FOR ACTIVATING IMPURITY LAYER — S89

FORM ELECTRODE CORRESPONDING TO SECOND ELECTRODE — S90

F I G. 4 4
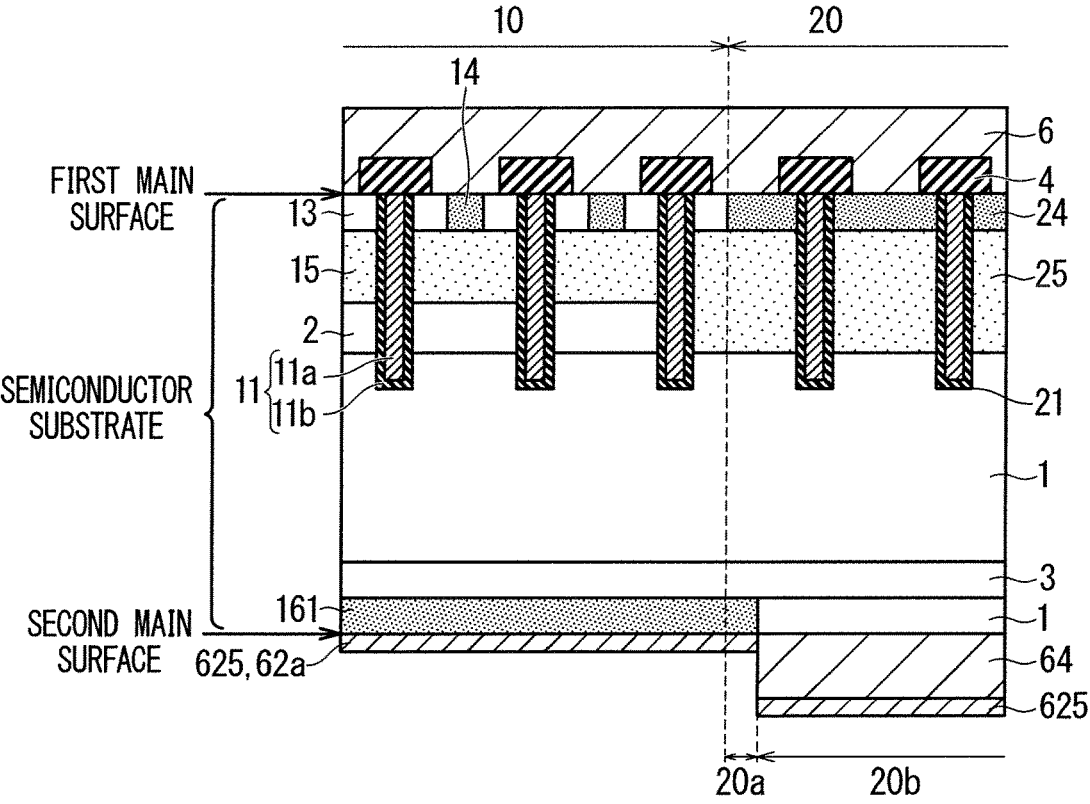
F I G. 4 5
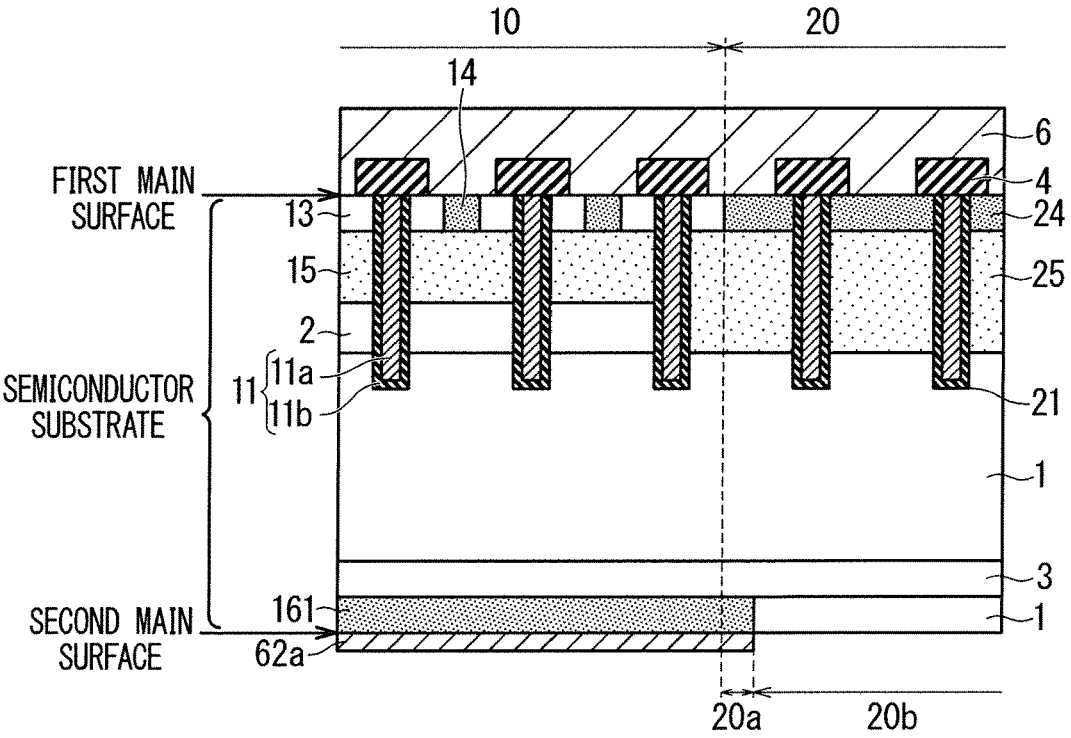

SEMICONDUCTOR DEVICE AND METHOD FOR MANUFACTURING THE SAME

BACKGROUND OF THE INVENTION

Field of the Invention

The present disclosure relates to a semiconductor device and a method for manufacturing the semiconductor device.

Description of the Background Art

There are semiconductor devices in which an IGBT region and a diode region are provided in one semiconductor substrate. In such a semiconductor device, a technique has been proposed in which forming two electrodes having different work functions in a p-type collector layer and an n-type cathode layer reduces contact resistance to both the p-type collector layer and the n-type cathode layer (for example, Japanese Patent No. 5724887).

In a semiconductor device as described above, a region is provided in which metal in ohmic contact with the n-type cathode layer is also in contact with the p-type collector layer. However, since this region acts as an ineffective region that does not operate as an IGBT or a diode, there is a problem that the chip size increases.

SUMMARY

The present disclosure has been made in view of the above problems, and an object thereof is to provide a technique capable of reducing the chip size.

A semiconductor device according to the present disclosure includes: a semiconductor substrate having a first main surface and a second main surface opposite to the first main surface, in which an IGBT region and a diode region are defined; an emitter layer of a first conductivity type provided on a first main surface side being a side of the first main surface in the IGBT region; a collector layer of a second conductivity type provided on a second main surface side being a side of the second main surface in the IGBT region; an anode layer of the second conductivity type provided on the first main surface side in the diode region; a cathode layer of the first conductivity type provided on the second main surface side in the diode region; a first electrode connected to the collector layer and a first portion on a side of the collector layer in the cathode layer; and a second electrode connected to a second portion of the cathode layer excluding the first portion. A work function of the first electrode is larger than a work function of the second electrode, and one of the first electrode and the second electrode and the semiconductor substrate sandwich another of the first electrode and the second electrode in a thickness direction of the semiconductor substrate.

The chip size can be reduced.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 3 is a cross-sectional view showing a configuration of a semiconductor device according to a third preferred embodiment;

FIG. 4 is a cross-sectional view showing a configuration of a semiconductor device according to a fourth preferred embodiment;

FIG. 7 is a cross-sectional view showing a configuration of a semiconductor device according to a seventh preferred embodiment;

FIG. 8 is a cross-sectional view showing a configuration of a semiconductor device according to an eighth preferred embodiment;

FIG. 9 is a flowchart showing a method for manufacturing a semiconductor device according to a ninth preferred embodiment;

FIGS. 10 to 16 are cross-sectional views showing a method for manufacturing the semiconductor device according to the ninth preferred embodiment;

FIG. 17 is a flowchart showing a method for manufacturing a semiconductor device according to a tenth preferred embodiment;

FIGS. 18 to 24 are cross-sectional views showing a method for manufacturing the semiconductor device according to the tenth preferred embodiment;

FIG. 25 is a flowchart showing a method for manufacturing a semiconductor device according to an eleventh preferred embodiment;

FIGS. 26 to 32 are cross-sectional views showing a method for manufacturing the semiconductor device according to the eleventh preferred embodiment;

FIG. 33 is a flowchart showing a method for manufacturing a semiconductor device according to a twelfth preferred embodiment;

FIGS. 34 to 40 are cross-sectional views showing a method for manufacturing the semiconductor device according to the twelfth preferred embodiment;

FIG. 41 is a flowchart showing a method for manufacturing a semiconductor device according to a thirteenth preferred embodiment; and FIGS. 42 to 48 are cross-sectional views showing a method for manufacturing the semiconductor device according to the thirteenth preferred embodiment.

DESCRIPTION OF THE PREFERRED EMBODIMENTS

Figure 1:
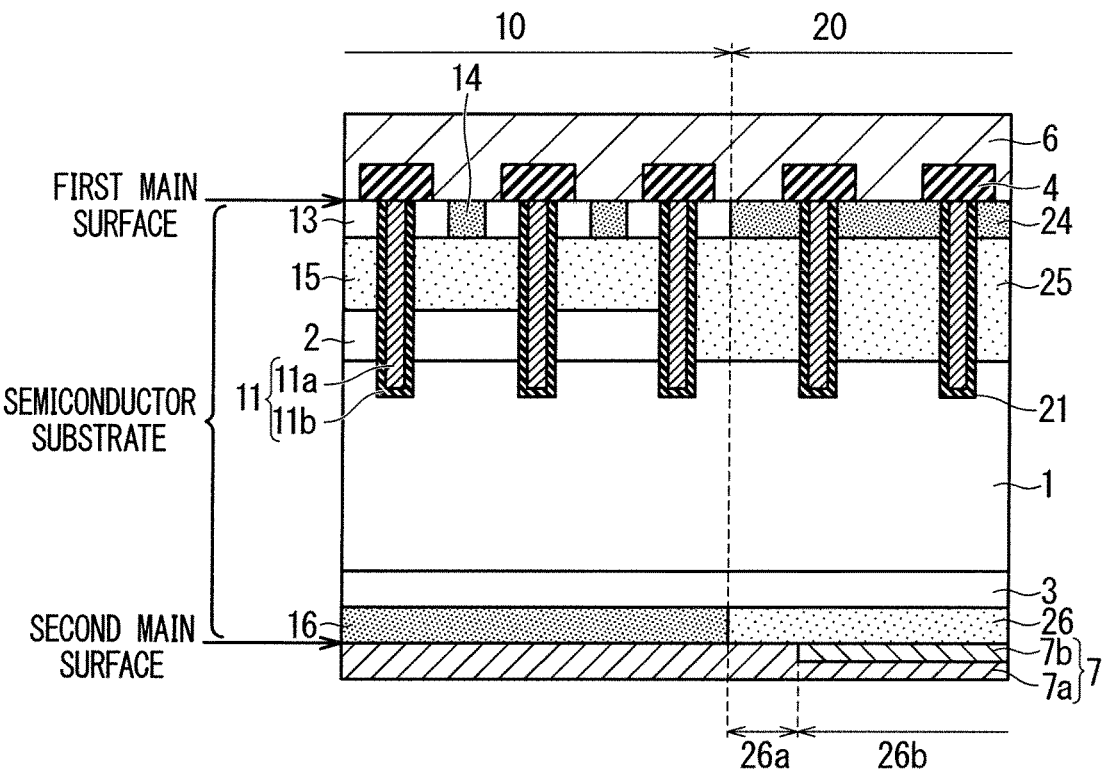
FIG. 1 is a cross-sectional view showing a configuration of a semiconductor device according to a first preferred embodiment.

Hereinafter, preferred embodiments will be described with reference to the accompanying drawings. Features described in each of the following preferred embodiments are illustrative, and all features are not necessarily essential. In addition, in the following description, similar components in a plurality of preferred embodiments are denoted by the same or similar reference numerals, and different components will be mainly described. In addition, in the following description, a specific position and direction such as "upper", "lower", "left", "right", "front", or "back" do not necessarily need to coincide with a position and direction at the time of actual implementation. In addition, the fact that a certain portion has a higher concentration than another portion means that, for example, the average of the concentrations of the certain portion is higher than the average of the concentrations of the other portion. Conversely, the fact that a certain portion has a lower concentration than another portion means that, for example, the average of the concentrations of the certain portion is lower than the average of the concentrations of the other portion. In addition, in the following description, the first conductivity type is n-type and the second conductivity type is p-type, but the first conductivity type may be p-type and the second conductivity type may be n-type.

First Preferred Embodiment

FIG. 1 is a cross-sectional view showing a configuration of a semiconductor device according to the present first preferred embodiment. The semiconductor device in FIG. 1 includes a semiconductor substrate having a first main surface (upper surface in FIG. 1) and a second main surface (lower surface in FIG. 1) opposite to the first main surface.

An IGBT region 10 having an IGBT function and a diode region 20 having a diode function are defined in the semiconductor substrate. In a plan view, the IGBT region 10 and the diode region 20 may be provided in a stripe shape alternately arranged, or a plurality of diode regions 20 may be provided in an island shape in the IGBT region 10. A termination region 30 for holding a withstand voltage of the semiconductor device 101 is provided around a region obtained by combining a cell region including the IGBT region 10 and the diode region 20 and a pad region provided with various pads.

The semiconductor device in FIG. 1 includes a drift layer 1 of the first conductivity type, a buffer layer 3 of the first conductivity type, an interlayer insulating film 4, and an emitter electrode 6 in an IGBT region 10 and a diode region 20.

The drift layer 1 is provided between the first main surface and the second main surface of the semiconductor substrate. The drift layer 1 is a semiconductor layer containing, for example, arsenic or phosphorus as first conductivity type impurities, and the concentration of the first conductivity type impurities is, for example, $1.0E+12/cm^3$ to $1.0E+15/cm^3$.

The buffer layer 3 is provided on the second main surface side with respect to the drift layer 1. The buffer layer 3 is provided to suppress punch-through of a depletion layer extending from the base layer 15 toward the second main surface when the semiconductor device is in an OFF state. The buffer layer 3 is a semiconductor layer having, for example, at least one of phosphorus (P) and protons (H+) as first conductivity type impurities, and the concentration of the first conductivity type impurities is, for example, $1.0E+12/cm^3$ to $1.0E+18/cm^3$. The impurity concentration of the first conductivity type of the buffer layer 3 is higher than the impurity concentration of the first conductivity type of the drift layer 1. It should be noted that the drift layer 1 may be provided in the buffer layer 3 in FIG. 1.

The interlayer insulating film 4 is connected to the first main surface of the semiconductor substrate, and the interlayer insulating film 4 is provided with an opening for exposing the semiconductor substrate. The emitter electrode 6 is electrically connected to the semiconductor substrate through the opening of the interlayer insulating film 4. The emitter electrode 6 may be an electrode made of, for example, an aluminum alloy such as an aluminum silicon alloy (Al—Si-based alloy), or may be an electrode including a plurality of layers of metal films in which a plating film is formed on an electrode formed of an aluminum alloy by electroless plating or electrolytic plating.

It should be noted that a barrier metal made of a conductor containing titanium (Ti) may be provided between the emitter electrode 6 in the opening of the interlayer insulating film 4 and the semiconductor substrate. In addition, a tungsten film having favorable embeddability may be provided in a region where favorable embedding cannot be obtained by the emitter electrode 6, and the emitter electrode 6 may be provided on the tungsten film.

In the IGBT region 10, the semiconductor device in FIG. 1 includes a carrier accumulation layer 2 of the first conductivity type, a base layer 15 of the second conductivity type, an emitter layer 13 of the first conductivity type, a contact layer 14 of the second conductivity type, a gate electrode 11a, a gate insulating film 11b, and a collector layer 16 of the second conductivity type.

The carrier accumulation layer 2 is provided on the first main surface side with respect to the drift layer 1. The carrier accumulation layer 2 is provided to reduce conduction loss when a current flows through the IGBT region 10. The carrier accumulation layer 2 is a semiconductor layer containing, for example, arsenic or phosphorus as first conductivity type impurities, and the concentration of the first conductivity type impurities is, for example, $1.0E+13/cm^3$ to $1.0E+17/cm^3$. The impurity concentration of the first conductivity type of the carrier accumulation layer 2 is higher than the impurity concentration of the first conductivity type of the drift layer 1. It should be noted that the drift layer 1 may be provided in the carrier accumulation layer 2 in FIG. 1.

The base layer 15 is provided on the first main surface side with respect to the carrier accumulation layer 2. The base layer 15 is a semiconductor layer containing, for example, boron or aluminum as second conductivity type impurities, and the concentration of the second conductivity type impurities is, for example, $1.0E+12/cm^3$ to $1.0E+19/cm^3$.

The emitter layer 13 and the contact layer 14 are provided on the first main surface side with respect to the base layer 15, and constitute the first main surface of the semiconductor substrate in the example in FIG. 1. The emitter layer 13 is a semiconductor layer containing, for example, arsenic or phosphorus as first conductivity type impurities, and the concentration of the first conductivity type impurities is, for example, $1.0E+17/cm^3$ to $1.0E+20/cm^3$. The contact layer 14 is a semiconductor layer containing, for example, boron or aluminum as second conductivity type impurities, and the concentration of the second conductivity type impurities is, for example, $1.0E+15/cm^3$ to $1.0E+20/cm^3$. The impurity concentration of the second conductivity type of the contact layer 14 is higher than the impurity concentration of the second conductivity type of the base layer 15. It should be noted that the base layer 15 may be provided in the contact layer 14 in FIG. 1. In addition, the emitter layer 13 and the contact layer 14 may be alternately provided along the extending direction of the active trench 11.

An active trench 11 that penetrates the emitter layer 13, the base layer 15, and the carrier accumulation layer 2 from the first principal surface and reaches the drift layer 1 is provided in the semiconductor substrate. The gate insulating film 11b is in contact with the emitter layer 13, the base layer 15, and the carrier accumulation layer 2. The gate electrode 11a is provided on the inner wall of the active trench 11 with interposition of the gate insulating film 11b. The gate electrode 11a and the gate insulating film 11b may be collectively referred to as an active trench 11. Application of a gate drive voltage to the gate electrode 11*a* forms a channel in the base layer 15 in contact with the gate insulating film 11*b* of the active trench 11.

The collector layer 16 is provided on the second main surface side with respect to the buffer layer 3, and constitutes the second main surface of the semiconductor substrate in the example in FIG. 1. The collector layer 16 is a semiconductor layer containing, for example, boron or aluminum as second conductivity type impurities, and the concentration of the second conductivity type impurities is, for example, $1.0E+16/cm^3$ to $1.0E+20/cm^3$. The collector layer 16 may be provided to partially protrude from the IGBT region 10 to the diode region 20.

In the diode region 20, the semiconductor device in FIG. 1 includes a diode trench 21, an anode layer 25 of the second conductivity type, a contact layer 24 of the second conductivity type, and a cathode layer 26 of the first conductivity type.

The anode layer 25 is provided on the first main surface side with respect to the drift layer 1. The anode layer 25 is a semiconductor layer containing, for example, boron or aluminum as second conductivity type impurities, and the concentration of the second conductivity type impurities is, for example, $1.0E+12/cm^3$ to $1.0E+19/cm^3$. It should be noted that a semiconductor layer corresponding to the carrier accumulation layer 2 in the IGBT region 10 may be provided between the anode layer 25 and the drift layer 1.

The contact layer 24 is provided on the first main surface side with respect to the anode layer 25, and constitutes the first main surface of the semiconductor substrate in the example in FIG. 1. The contact layer 24 is a semiconductor layer containing, for example, boron or aluminum as second conductivity type impurities, and the concentration of the second conductivity type impurities is, for example, $1.0E+15/cm^3$ to $1.0E+20/cm^3$. The impurity concentration of the second conductivity type of the contact layer 24 is higher than the impurity concentration of the second conductivity type of the anode layer 25. It should be noted that an anode layer 25 may be provided in the contact layer 24 in FIG. 1. In addition, the contact layer 24 and the anode layer 25 may be alternately provided in the extending direction of the diode trench 21.

In the semiconductor substrate in the diode region 20, a diode trench 21 having a conductor portion and an insulating film similar to those of the gate electrode 11*a* and the gate insulating film 11*b* of the active trench 11 in the IGBT region 10 is provided. The diode trench 21 penetrates the contact layer 24 and the anode layer 25 from the first main surface and reaches the drift layer 1. The conductor portion of the diode trench 21 is electrically connected to, for example, the emitter electrode 6.

The cathode layer 26 is provided on the second main surface side with respect to the buffer layer 3. The cathode layer 26 is a semiconductor layer containing, for example, arsenic or phosphorus as first conductivity type impurities, and the concentration of the first conductivity type impurities is, for example, $1.0E+16/cm^3$ to $1.0E+21/cm^3$.

The semiconductor device in FIG. 1 includes a first electrode 7*a* and a second electrode 7*b*. It should be noted that the first electrode 7*a* and the second electrode 7*b* may be collectively referred to as a collector electrode 7.

The first electrode 7*a* is connected to the collector layer 16 and a connection portion 26*a* being a first portion on the collector layer 16 side of the cathode layer 26. For a material of the first electrode 7*a*, for example, a metal such as aluminum (Al) is used.

The second electrode 7*b* is connected to the remainder 26*b* being the second portion of the cathode layer 26 excluding the connection portion 26*a*. For a material of the second electrode 7*b*, for example, a metal such as titanium (Ti) is used.

Here, in the present first preferred embodiment, the work function of the first electrode 7*a* is larger than the work function of the second electrode 7*b*. Accordingly, the contact resistance between the first electrode 7*a* and the collector layer 16 of the second conductivity type can be reduced, and the contact resistance between the second electrode 7b and the cathode layer 26 of the first conductivity type can be reduced. That is, since electrodes having appropriate work functions are provided below the respective collector layer 16 and cathode layer 26, the contact resistance can be reduced.

In addition, in the present first preferred embodiment, the first electrode 7*a* is connected to the connection portion 26*a* of the cathode layer 26, and the first electrode 7*a* and the cathode layer 26 are Schottky joined. Accordingly, by discharging holes from the connection portion 26*a* during diode operation, recovery loss can be reduced. In addition, since the ineffective region that does not operate as the IGBT or as the diode can be reduced, the chip size can be reduced.

In addition, in the present first preferred embodiment, one of the first electrode 7*a* and the second electrode 7*b* and the semiconductor substrate sandwich the other of the first electrode 7*a* and the second electrode 7*b* in the thickness direction of the semiconductor substrate. In the example in FIG. 1, the first electrode 7*a* includes a protruding portion which protrudes along the second electrode 7*b* and sandwiches the second electrode 7*b* between the first electrode 7*a* and the semiconductor substrate.

According to this configuration, oxidation of the surface of the second electrode 7*b* can be suppressed.

It should be noted that the structures of the IGBT region 10 and the diode region 20 formed on the first main surface side are not limited to the above, and may be, for example, a planar gate structure or an integrated structure. In addition, the IGBT region 10 may be provided with a dummy trench having the same configuration as the diode trench 21 and having a conductor portion corresponding to the gate electrode 11*a* and electrically connected to the emitter electrode 6.

Second Preferred Embodiment

Figure 2:
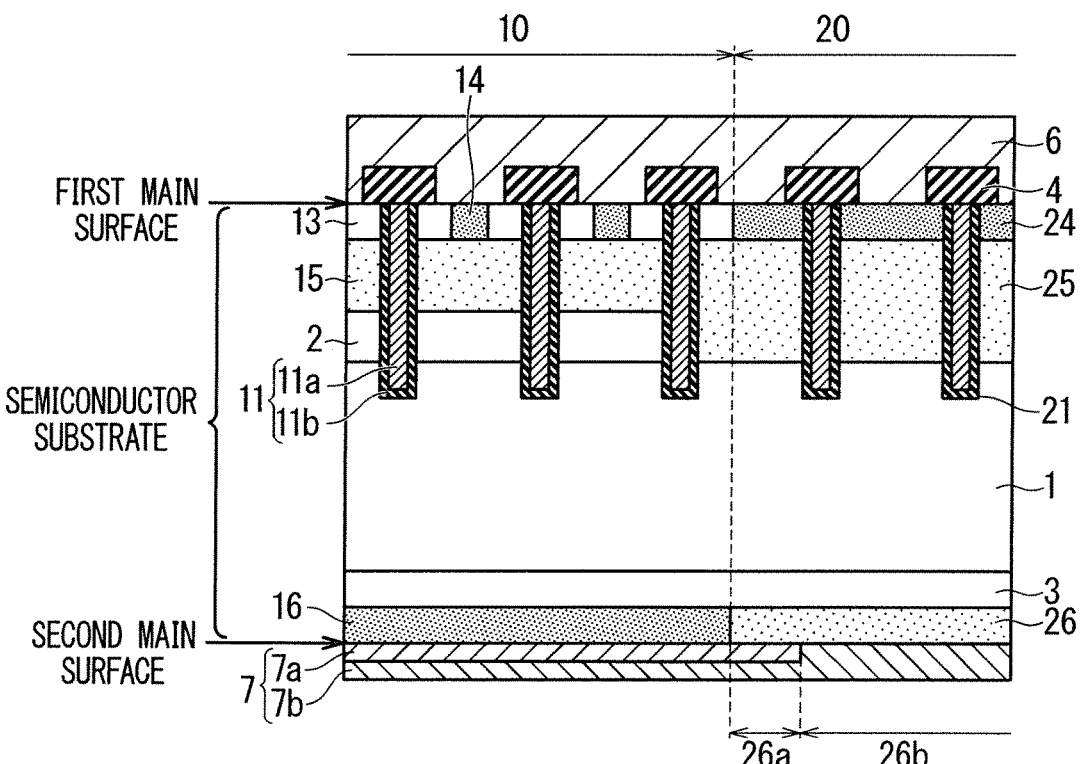
FIG. 2 is a cross-sectional view showing a configuration of a semiconductor device according to a second preferred embodiment.

FIG. 2 is a cross-sectional view showing a configuration of a semiconductor device according to the present second preferred embodiment. As in the first preferred embodiment, also in the present second preferred embodiment, the work function of the first electrode 7*a* is larger than the work function of the second electrode 7*b*, and the first electrode 7*a* is connected to the connection portion 26*a* of the cathode layer 26. Accordingly, the contact resistance and the ineffective region can be reduced.

In addition, also in the present second preferred embodiment, as in the first preferred embodiment, one of the first electrode 7*a* and the second electrode 7*b* and the semiconductor substrate sandwich the other of the first electrode 7*a* and the second electrode 7*b* in the thickness direction of the semiconductor substrate. However, in the example in FIG. 2, the second electrode 7*b* includes a protruding portion which protrudes along the first electrode 7*a* and sandwiches the first electrode 7*a* between the second electrode 7*b* and the semiconductor substrate. According to this configuration, oxidation of the surface of the first electrode 7a can be suppressed.

Third Preferred Embodiment

FIG. 3 is a cross-sectional view showing a configuration of a semiconductor device according to the present third preferred embodiment. The configuration of the present third preferred embodiment is similar to the configuration in which the third electrode 8 is added to the configuration of the first preferred embodiment. The third electrode 8 is provided on the side opposite to the collector layer 16 and the cathode layer 26 with respect to the first electrode 7a and the second electrode 7b. In the example in FIG. 3, the third electrode 8 is connected to the first electrode 7a.

When a semiconductor device is mounted on a substrate (not shown), the third electrode 8 is joined to a metal portion such as copper (Cu) of the substrate through, for example, solder or silver (Ag) paste. According to this configuration, the contact resistance to the semiconductor substrate can be controlled with the materials of the first electrode 7a and the second electrode 7b, the joining strength to the substrate can be controlled with the material of the third electrode 8, and these controls can be performed independently of each other. In addition, oxidation of the first electrode 7a can be suppressed.

It should be noted that the third electrode 8 may be one metal layer or a plurality of metal layers. In addition, although the third electrode 8 is added to the configuration of the first preferred embodiment in the above description, the third electrode 8 may be added to the configuration of the second preferred embodiment. That is, in the second preferred embodiment, the third electrode 8 may be connected to the second electrode 7b. In this case, oxidation of the second electrode 7b can be suppressed.

Fourth Preferred Embodiment

FIG. 4 is a cross-sectional view showing a configuration of a semiconductor device according to the present fourth preferred embodiment. The configuration of the present fourth preferred embodiment is similar to the configuration in which the protective electrode 7c is added to the configuration of the first preferred embodiment. The protective electrode 7c is provided between the first electrode 7a and the second electrode 7b mutually positioned in the thickness direction. In the example in FIG. 4, the protective electrode 7c is provided below the second electrode 7b.

Here, from forming the second electrode 7b to forming the first electrode 7a, the second main surface of the semiconductor substrate may be treated with a chemical solution, plasma, or the like. In this case, treatment on the second main surface may adversely affect the second electrode 7b. On the other hand, according to the configuration of the present fourth preferred embodiment, the second electrode 7b can be protected from the above treatment by the protective electrode 7c.

It should be noted that although the protective electrode 7c is added to the configuration of the first preferred embodiment in the above description, the protective electrode 7c may be added to the configuration of the second preferred embodiment. That is, in the second preferred embodiment, the protective electrode 7c may be provided below the first electrode 7a. In addition, the present fourth preferred embodiment may be applied to the third preferred embodiment.

Fifth Preferred Embodiment

Figure 5:
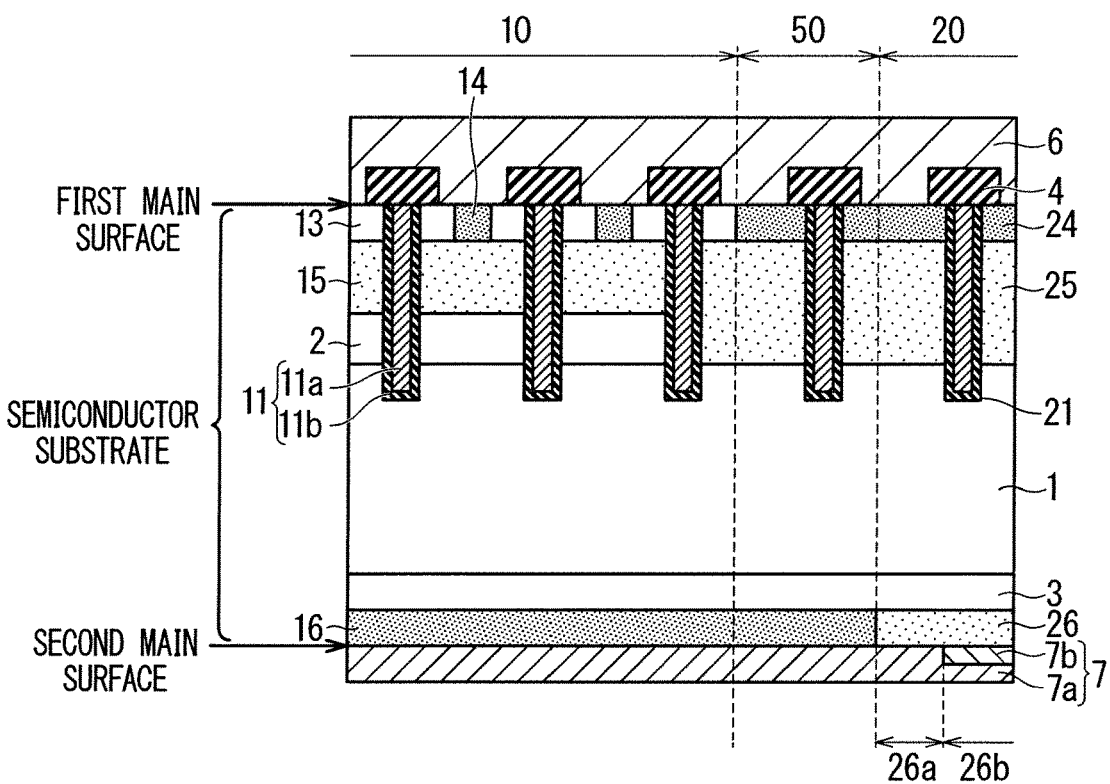
FIG. 5 is a cross-sectional view showing a configuration of a semiconductor device according to a fifth preferred embodiment.

FIG. 5 is a cross-sectional view showing a configuration of a semiconductor device according to the present fifth preferred embodiment. In the configuration of the present fifth preferred embodiment, a boundary region 50 is defined between the IGBT region 10 and the diode region 20 of the configuration of the first preferred embodiment. Then, the anode layer 25 is provided on the first main surface side in the boundary region 50, and the collector layer 16 is provided on the second main surface side in the boundary region 50.

According to this configuration of the present fifth preferred embodiment, the distance between the active trench 11 in the IGBT region 10 and the cathode layer 26 can be increased. Therefore, since the operation of the parasitic n-type MOSFET configured by the active trench 11a and the cathode layer 26 can be suppressed, snapback can be suppressed. In addition, since the distance between the contact layer 14 in the IGBT region 10 and the cathode layer 26 can be increased, recovery loss can be reduced. It should be noted that the present fifth preferred embodiment may be applied to the second to fourth preferred embodiments.

Sixth Preferred Embodiment

Figure 6:
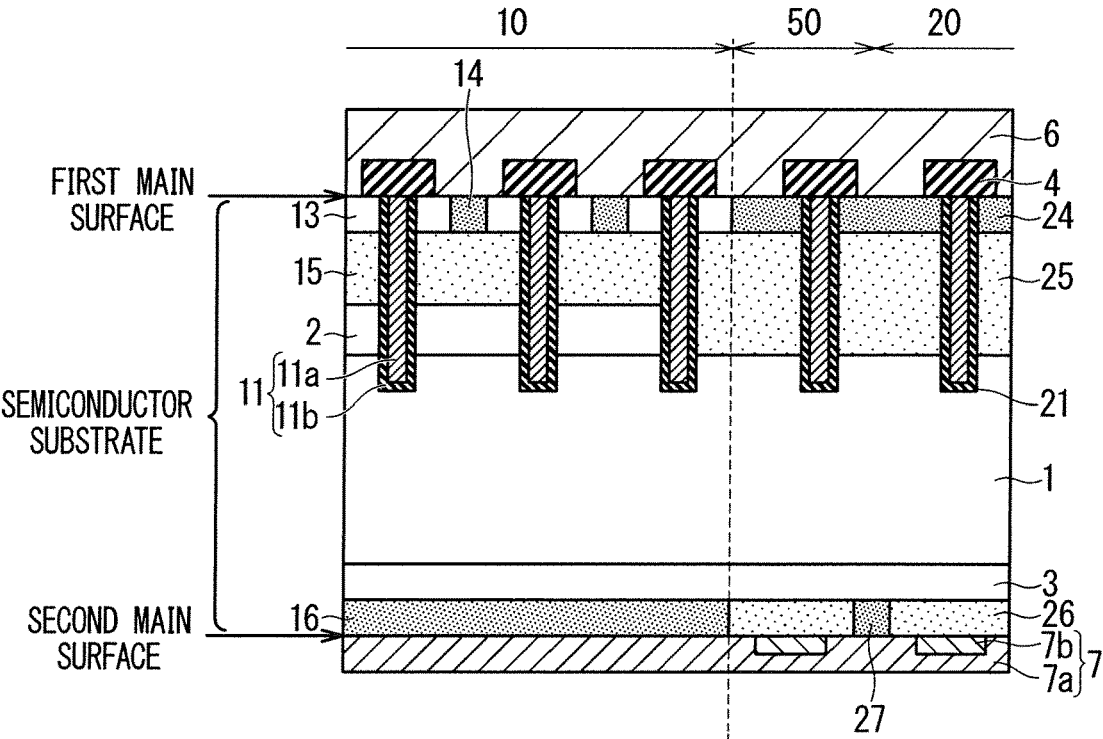
FIG. 6 is a cross-sectional view showing a configuration of a semiconductor device according to a sixth preferred embodiment.

FIG. 6 is a cross-sectional view showing a configuration of a semiconductor device according to the present sixth preferred embodiment. The configuration of the present sixth preferred embodiment is similar to the configuration in which an impurity layer 27 of the second conductivity type is added to the configuration of the first preferred embodiment. The impurity layer 27 is provided on the second main surface side in the diode region 20, and both sides of the impurity layer 27 are in contact with the cathode layer 26. The impurity concentration of the impurity layer 27 is substantially the same as the impurity concentration of the collector layer 16. In FIG. 6, the number of impurity layers 27 is one, but may be two or more. The impurity layer 27 is connected to the buffer layer 3 and the first electrode 7a. According to this configuration of the present sixth preferred embodiment, since the number of electrons injected from the cathode layer 26 can be reduced, recovery loss can be reduced. It should be noted that the present sixth preferred embodiment may be applied to the first to fifth preferred embodiments.

Seventh Preferred Embodiment

FIG. 7 is a cross-sectional view showing a configuration of a semiconductor device according to the present seventh preferred embodiment. In the present seventh preferred embodiment, in the configuration of the first preferred embodiment, the thickness of the portion to which the second electrode 7b is connected in the semiconductor substrate is smaller than the thickness of the portion to which the first electrode 7a is connected in the semiconductor substrate. In the example in FIG. 7, since the position of the second main surface on the right side is positioned above the position of the second main surface on the left side, the portion on the right side of the semiconductor substrate is thinner than the portion on the left side. According to this configuration, the ON-voltage at the time of diode operation can be reduced. It should be noted that the present seventh preferred embodiment may be applied to the second to sixth preferred embodiments.

Eighth Preferred Embodiment

FIG. 8 is a cross-sectional view showing a configuration of a semiconductor device according to the present eighth preferred embodiment. The configuration of the present eighth preferred embodiment is similar to the configuration in which an intermetallic insulating film 9 being the first insulating film is added to the configuration of the first preferred embodiment. Then, the second electrode 7b is connected to the remainder 26b of the cathode layer 26 with interposition of the intermetallic insulating film 9.

Here, when the Schottky barrier height formed at the interface between the semiconductor substrate and the metal does not match the difference between the work function of the metal and the electron affinity of the semiconductor substrate due to the influence of the interface state or the like, Fermi level pinning may occur. On the other hand, according to the configuration of the present eighth preferred embodiment, since the thin intermetallic insulating film 9 is provided at the interface between the semiconductor substrate and the metal, the Fermi level pinning can be relaxed, and the controllability of the contact resistance by the work function of the metal can be improved.

It should be noted that the present eighth preferred embodiment may be applied to the second to seventh preferred embodiments. For example, in the second preferred embodiment, the first electrode 7a may be connected to the collector layer 16 and the connection portion 26a of the cathode layer 26 with interposition of the intermetallic insulating film 9.

Ninth Preferred Embodiment

The present ninth preferred embodiment is a method for manufacturing the semiconductor device (see FIG. 1) and the like according to the first preferred embodiment. That is, the present preferred embodiment is a method for manufacturing a semiconductor device configured so that the first electrode 7a and the semiconductor substrate sandwich the second electrode 7b in the thickness direction of the semiconductor substrate.

FIG. 9 is a flowchart showing the method for manufacturing the semiconductor device according to the present ninth preferred embodiment.

First, in step S1, a structure on the first main surface side of the semiconductor substrate is formed using resist coating and mask processing such as photolithography.

The structure on the first main surface side of the semiconductor substrate includes components on the first main surface side with respect to the drift layer 1, such as the gate electrode 11a.

In step S2, the second main surface side of the semiconductor substrate is polished to be thinned.

In step S3, first conductivity type impurities are implanted into the second main surface side of the semiconductor substrate to form the buffer layer 3.

In step S4, as shown in FIG. 10, second conductivity type impurities are implanted into the second main surface side of the semiconductor substrate in the IGBT region 10 and the diode region 20 to form a second conductivity type impurity layer 161 of the second conductivity type.

In step S5, as shown in FIG. 11, a resist 61 for exposing the remainder correspondence region 20b corresponding to the remainder 26b in the diode region 20 is formed using mask processing. It should be noted that, in the present ninth preferred embodiment, the second portion correspondence region is the remainder correspondence region 20b, and the same applies hereinafter.

Figure 12:
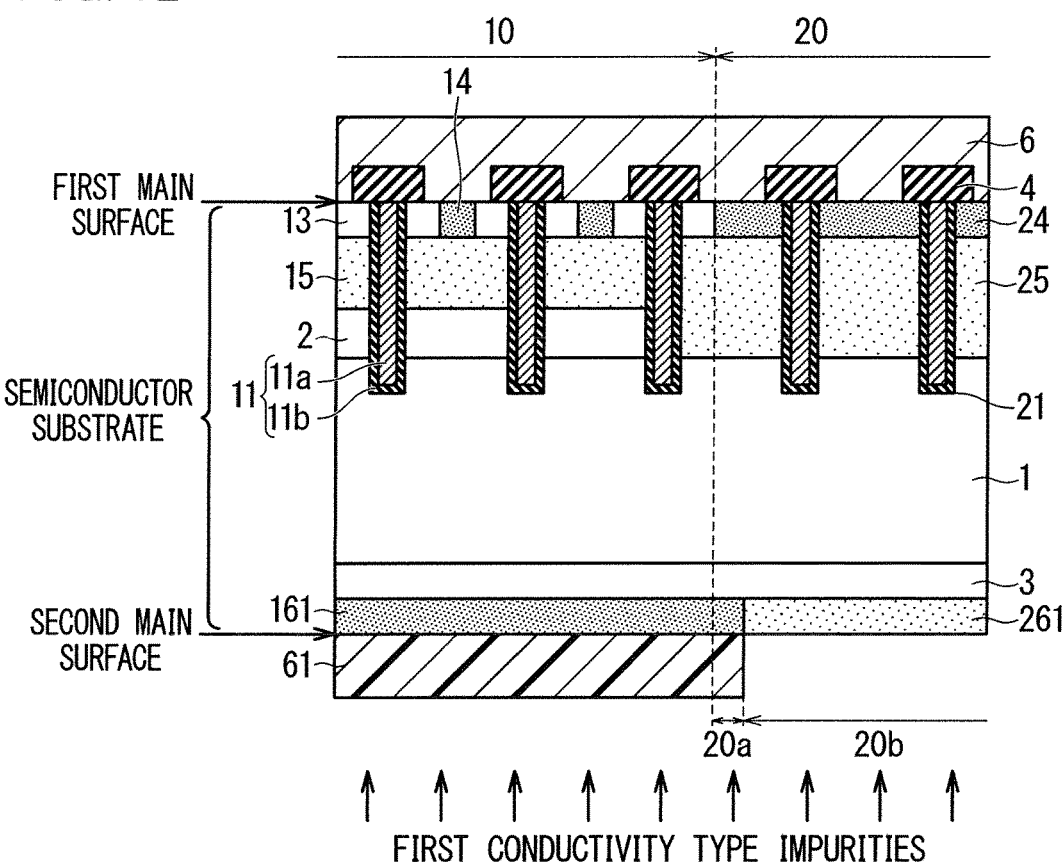

In step S6, as shown in FIG. 12, the first conductivity-type impurities are implanted into the second conductivity type impurity layer 161 of the remainder correspondence region 20b at an impurity concentration higher than the second conductivity type impurity concentration of the second conductivity type impurity layer 161. Accordingly, the first conductivity type impurity layer 261 of the first conductivity type is formed in the second conductivity type impurity layer 161 in the remainder correspondence region 20b.

Figure 13:
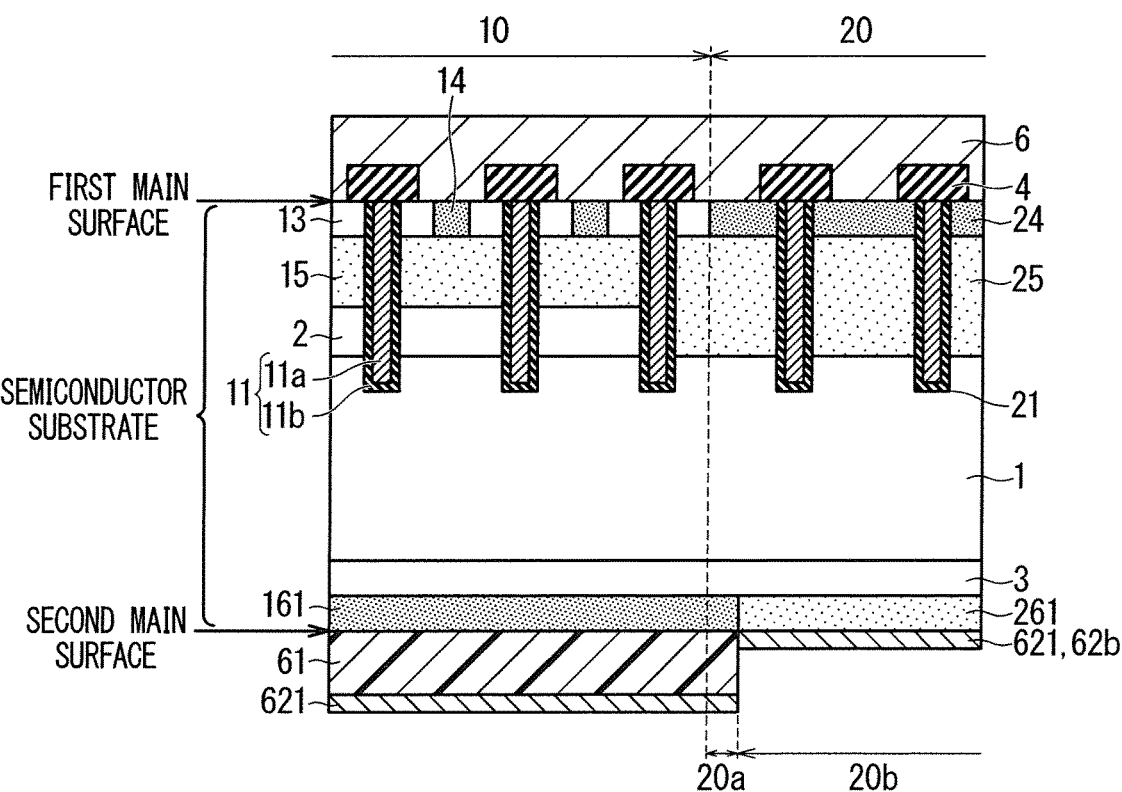

In step S7, as shown in FIG. 13, a conductive film 621 is formed, a part of which is connected to the first conductivity type impurity layer 261 in the remainder correspondence region 20b and the remainder is connected to the resist 61. Accordingly, an electrode 62b corresponding to the second electrode 7b is formed in the remainder correspondence region 20b. It should be noted that the electrode 62b corresponding to the second electrode 7b is an electrode that becomes the second electrode 7b when a series of steps is completed.

Figure 14:
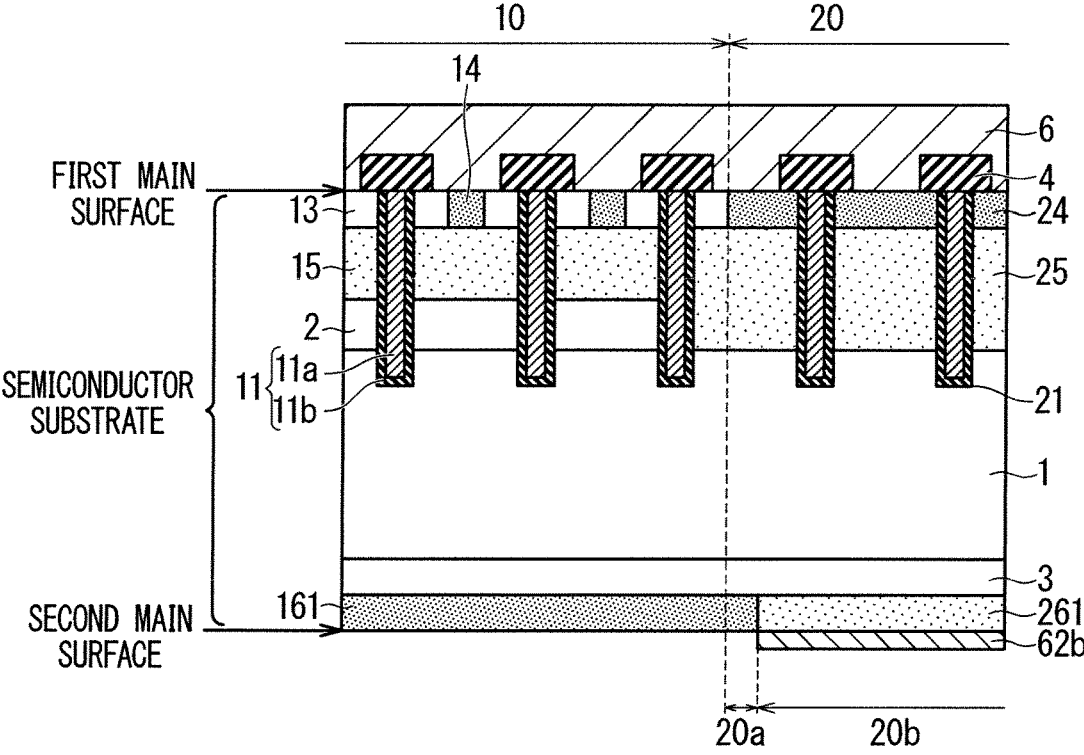

In step S8, as shown in FIG. 14, the resist 61 and the remainder of the conductive film 621 on the resist 61 are removed.

Figure 15:
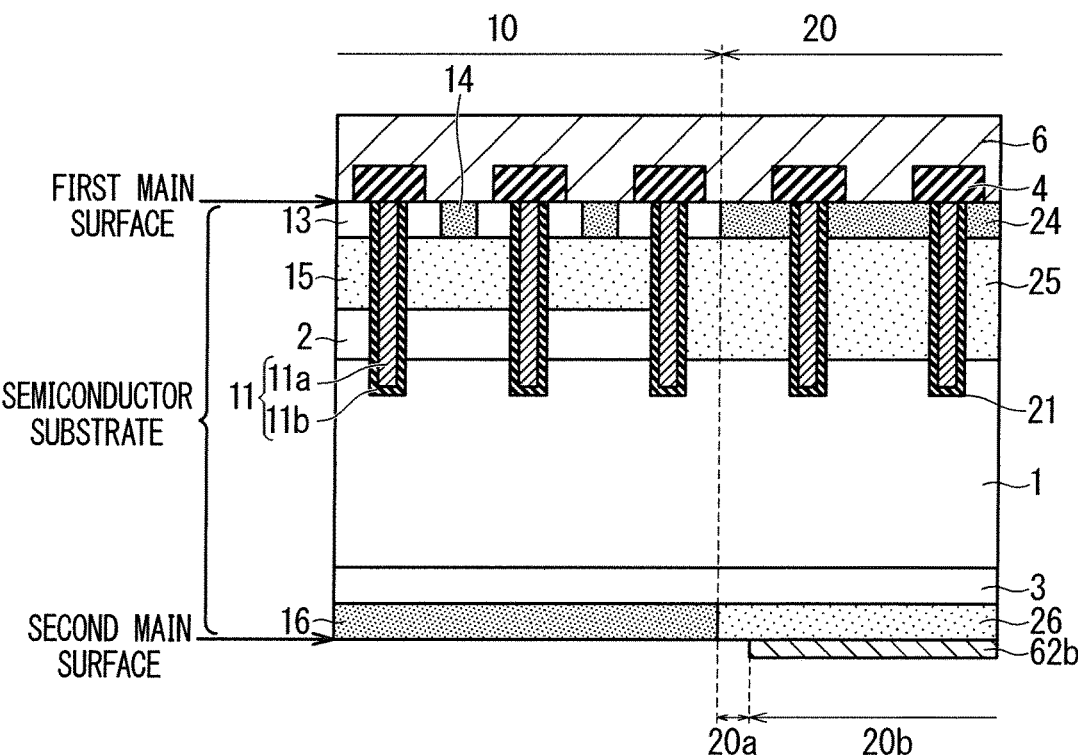

In step S9, as shown in FIG. 15, annealing is performed for activating the buffer layer 3, the second conductivity type impurity layer 161, and the first conductivity type impurity layer 261. Here, since the impurity concentration of the first conductivity type of the first conductivity type impurity layer 261 is higher than the impurity concentration of the second conductivity type of the second conductivity type impurity layer 161, the first conductivity type impurity layer 261 spreads toward the second conductivity type impurity layer 161 by annealing. Accordingly, in the second conductivity type impurity layer 161 in the connection portion correspondence region 20a corresponding to the connection portion 26a in the diode region 20, the first conductivity type impurity layer 261 is formed, and the collector layer 16 and the cathode layer 26 are formed. It should be noted that, in the present ninth preferred embodiment, the first portion correspondence region is the connection portion correspondence region 20a, and the same applies hereinafter.

In step 10, as shown in FIG. 16, an electrode 62a corresponding to the first electrode 7a is formed. It should be noted that the electrode 62a corresponding to the first electrode 7a is an electrode that becomes the first electrode 7a when a series of steps is completed. Thus, the semiconductor device is completed.

According to the manufacturing method according to the present ninth preferred embodiment as described above, since the first conductivity type impurity layer 261 to be the cathode layer 26 and the electrode 62b to be the second electrode 7b can be patterned using one mask, the manufacturing cost can be reduced.

Modification of Ninth Preferred Embodiment

By performing annealing after performing step S3 and step S4, activation of the buffer layer 3 and activation of the second conductivity type impurity layer 161 to be the collector layer 16 may be performed. In addition, after the resist 61 for exposing the remainder correspondence region 20b in the diode region 20 is formed in step S5, the semiconductor substrate may be etched and the semiconductor substrate in the diode region 20 may be thinned.

In addition, the first conductivity type impurity layer 261 larger than the width of the opening of the resist 61 may be formed by performing oblique implantation in step S6. In addition, the semiconductor substrate and the electrode 62b may be alloyed or nitrided by annealing in step S9. In addition, after the electrode 62a is formed in step S 10, the lower surface of the electrode 62a may be flattened. In addition, the order of steps S1 to S10 may be changed as appropriate, and for example, the order of steps S9 and S10 may be reversed.

Tenth Preferred Embodiment

The present tenth preferred embodiment is a method for manufacturing the semiconductor device (see FIG. 1) and the like according to the first preferred embodiment. That is, the present preferred embodiment is a method for manufacturing a semiconductor device configured so that the first electrode 7a and the semiconductor substrate sandwich the second electrode 7b in the thickness direction of the semiconductor substrate.

FIG. 17 is a flowchart showing the method for manufacturing the semiconductor device according to the present tenth preferred embodiment.

First, in steps S21 to S24, steps similar to steps S1 to S4 in FIG. 9 are performed, and the structure in FIG. 10 is obtained.

In step S25, as shown in FIG. 18, the second insulating film 63 and the resist 61 that expose the remainder correspondence region 20b in the diode region 20 are formed in this order.

In step S26, as shown in FIG. 19, the first conductivity-type impurities are implanted into the second conductivity type impurity layer 161 of the remainder correspondence region 20b at an impurity concentration higher than the second conductivity type impurity concentration of the second conductivity type impurity layer 161. Accordingly, the first conductivity type impurity layer 261 of the first conductivity type is formed in the second conductivity type impurity layer 161 in the remainder correspondence region 20b.

Figure 20:
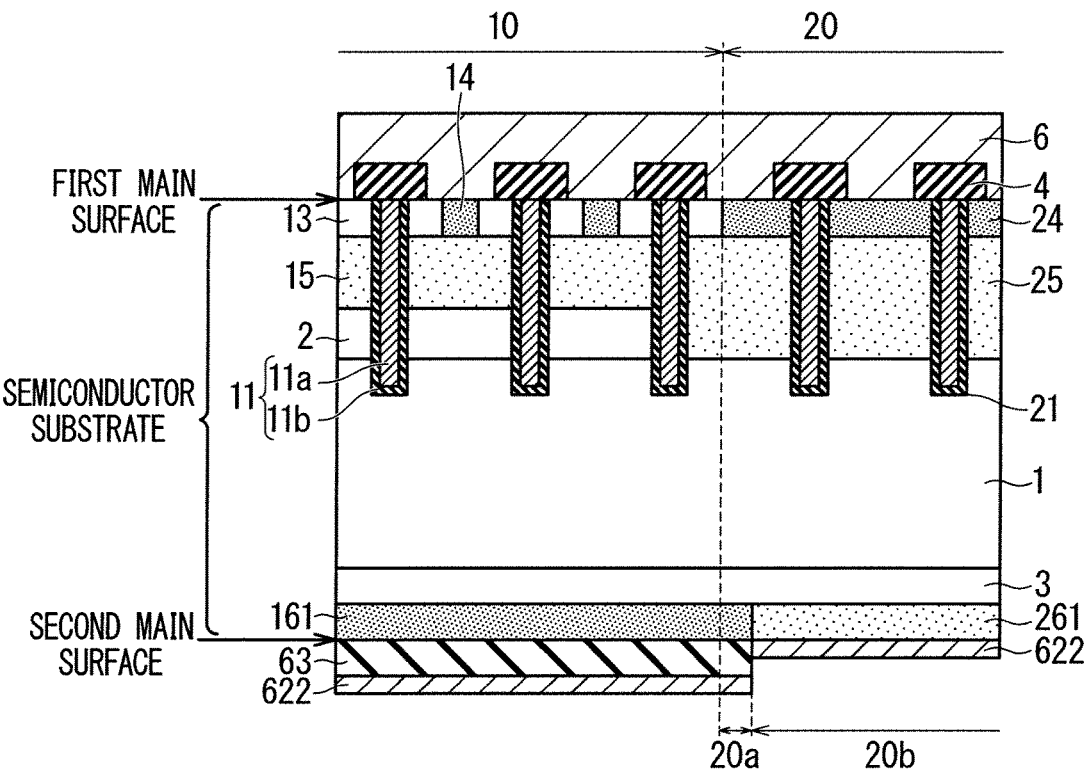

In step S27, as shown in FIG. 20, the resist 61 is removed.

In step S28, as shown in FIG. 20, a metal film 622 is formed, a part of which is connected to the first conductivity type impurity layer 261 in the remainder correspondence region 20b and the remainder is connected to the second insulating film 63.

Figure 21:
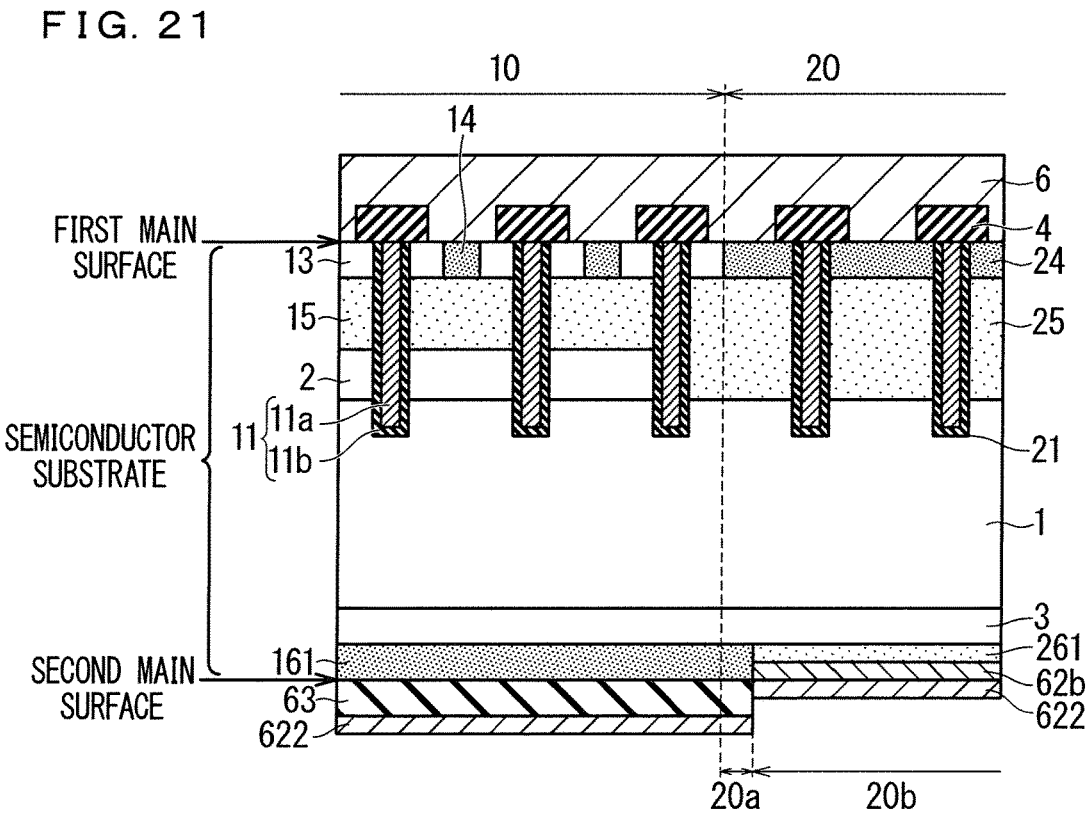

In step S29, as shown in FIG. 21, an electrode 62b corresponding to the second electrode 7b is formed by performing annealing for alloying the part of the metal film 622 and the first conductivity type impurity layer 261.

In step S30, as shown in FIG. 22, the second insulating film 63 and the unreacted metal film 622 are removed.

In step S31, as shown in FIG. 23, annealing is performed for activating the buffer layer 3, the second conductivity type impurity layer 161, and the first conductivity type impurity layer 261. By the annealing, the first conductivity type impurity layer 261 is formed in the second conductivity type impurity layer 161 in the connection portion correspondence region 20a in the diode region 20, and the collector layer 16 and the cathode layer 26 are formed.

Figure 24:
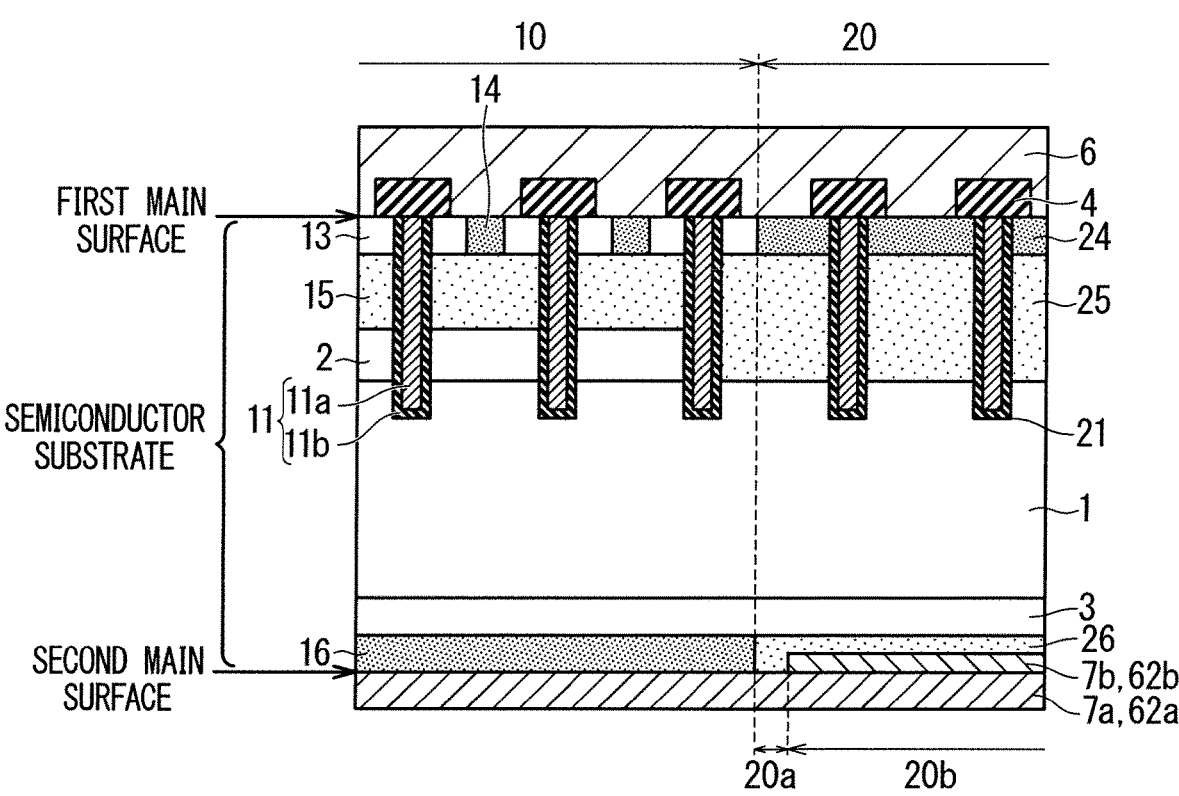

In step S32, as shown in FIG. 24, an electrode 62a corresponding to the first electrode 7a is formed. Thus, the semiconductor device is completed.

According to the manufacturing method according to the present tenth preferred embodiment as described above, since the first conductivity type impurity layer 261 to be the cathode layer 26 and the electrode 62b to be the second electrode 7b can be patterned using one mask, the manufacturing cost can be reduced. In addition, according to the present tenth preferred embodiment, since the resist 61 is not in contact with the surface of the semiconductor substrate, the cleanliness of the semiconductor substrate can be increased. It should be noted that, also in the present tenth preferred embodiment, a modification of the ninth preferred embodiment may be appropriately applied.

Eleventh Preferred Embodiment

The present eleventh preferred embodiment is a method for manufacturing the semiconductor device (see FIG. 2) and the like according to the second preferred embodiment. That is, the present preferred embodiment is a method for manufacturing a semiconductor device configured so that the second electrode 7b and the semiconductor substrate sandwich the first electrode 7a in the thickness direction of the semiconductor substrate.

FIG. 25 is a flowchart showing the method for manufacturing the semiconductor device according to the present eleventh preferred embodiment.

First, in steps S41 to S44, steps similar to steps S1 to S4 in FIG. 9 are performed, and the structure in FIG. 10 is obtained.

Figure 26:
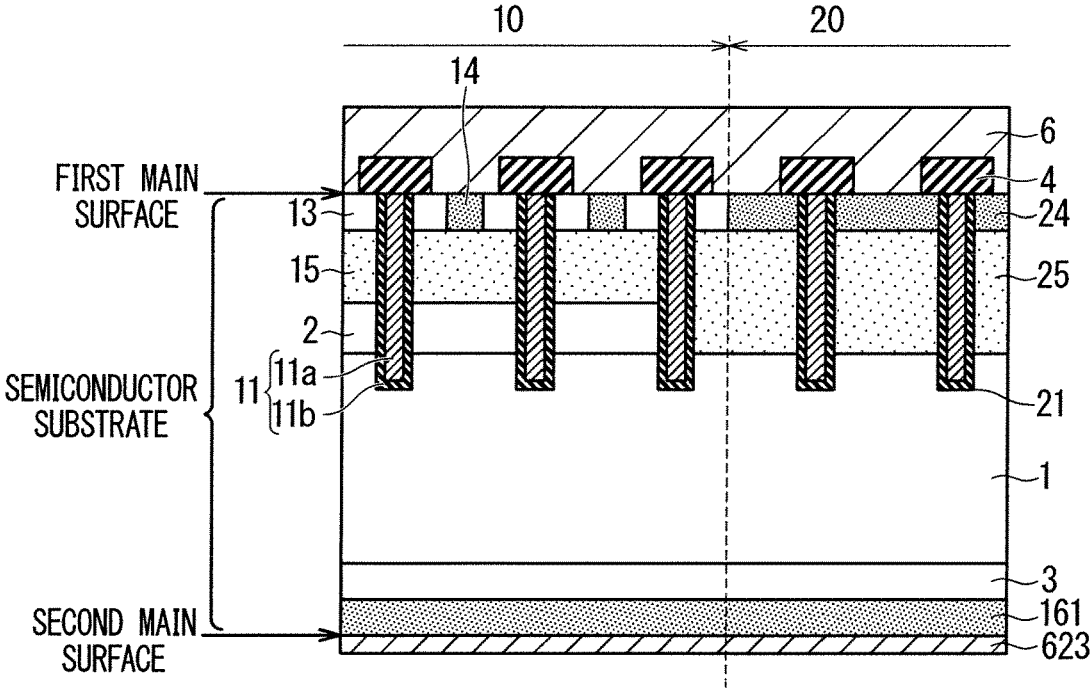

In step S45, as shown in FIG. 26, a conductive film 623 connected to the second conductivity type impurity layer 161 in the IGBT region 10 and the diode region 20 is formed.

Figure 27:
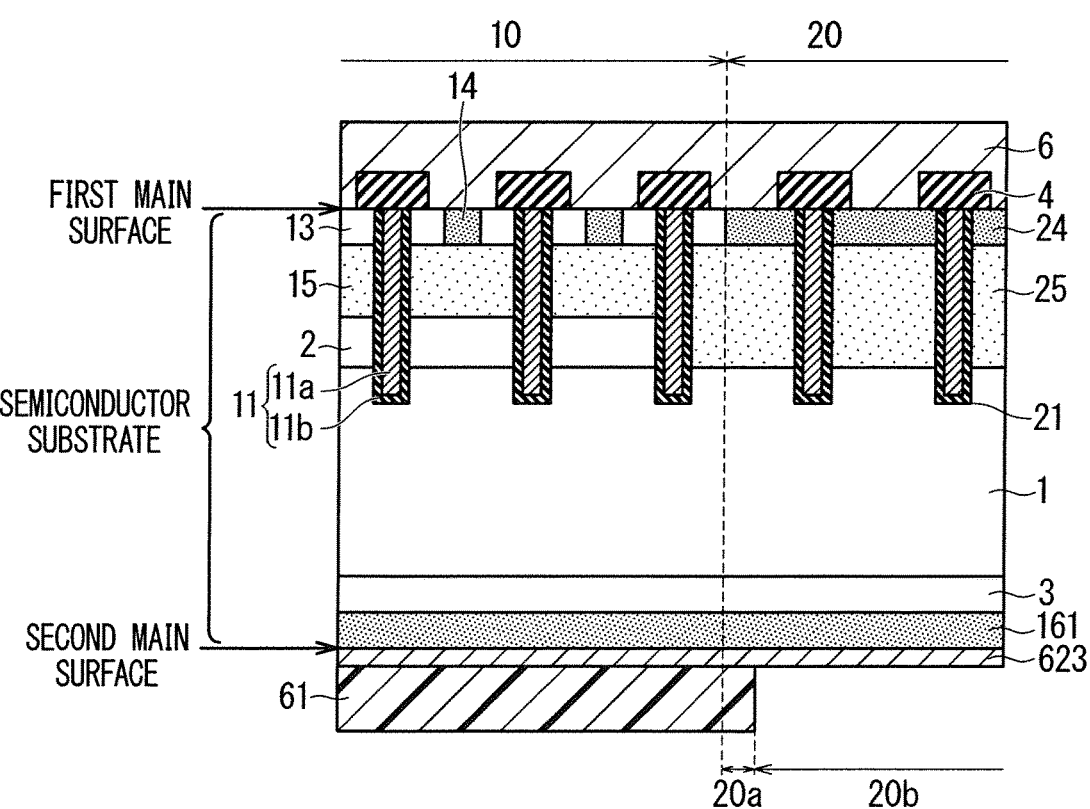

In step S46, as shown in FIG. 27, the resist 61 that exposes the remainder correspondence region 20b in the diode region 20 is formed.

In step S47, as shown in FIG. 28, the conductive film 623 in the remainder correspondence region 20b is removed, and the electrode 62a corresponding to the first electrode 7a is formed.

In step S48, as shown in FIG. 29, the first conductivity-type impurities are implanted into the second conductivity type impurity layer 161 of the remainder correspondence region 20b at an impurity concentration higher than the second conductivity type impurity concentration of the second conductivity type impurity layer 161. Accordingly, the first conductivity type impurity layer 261 of the first conductivity type is formed in the second conductivity type impurity layer 161 in the remainder correspondence region 20b.

In step S49, as shown in FIG. 30, the resist 61 is removed.

In step S50, as shown in FIG. 31, an electrode 62b corresponding to the second electrode 7b is formed.

Figure 32:
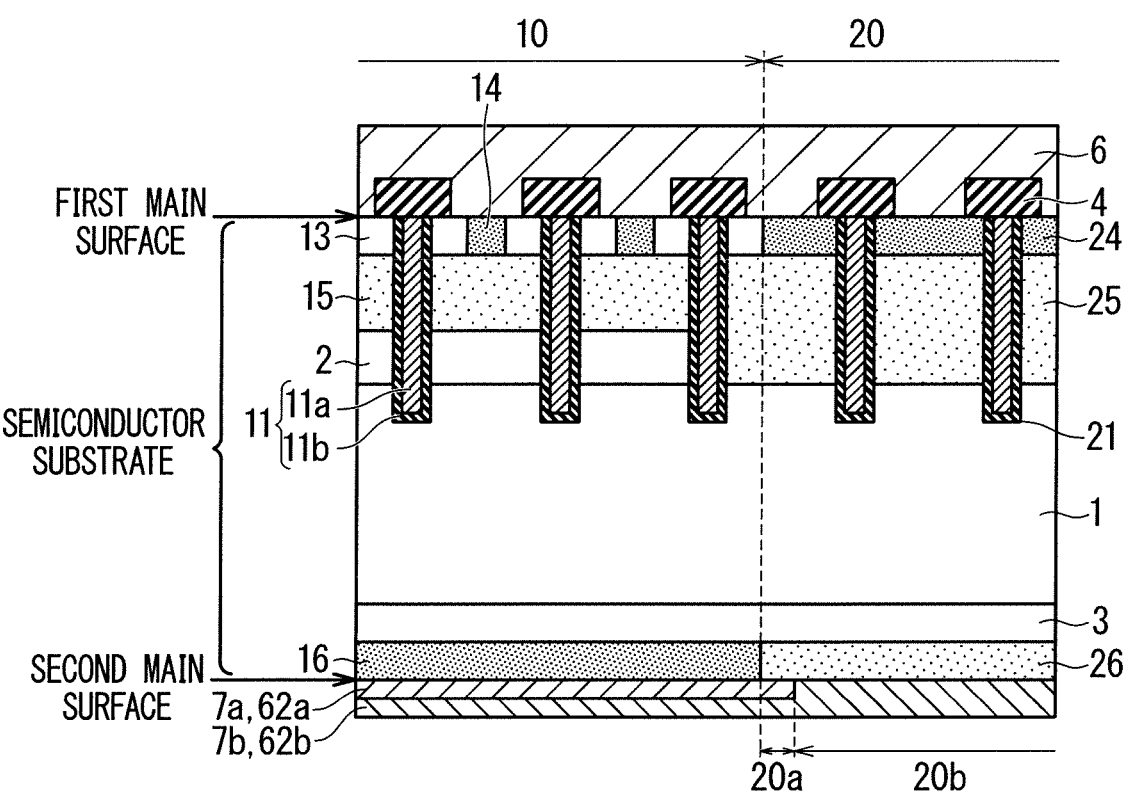

In step S51, as shown in FIG. 32, annealing is performed for activating the buffer layer 3, the second conductivity type impurity layer 161, and the first conductivity type impurity layer 261. By the annealing, the first conductivity type impurity layer 261 is formed in the second conductivity type impurity layer 161 in the connection portion correspondence region 20a in the diode region 20, and the collector layer 16 and the cathode layer 26 are formed. Thus, the semiconductor device is completed.

According to the manufacturing method according to the present eleventh preferred embodiment as described above, since the first conductivity type impurity layer 261 to be the cathode layer 26 and the electrode 62a to be the first electrode 7a can be patterned using one mask, the manufacturing cost can be reduced. In addition, according to the present eleventh preferred embodiment, since a step of removing the conductive film on the resist 61, such as lift-off, is not used, it is possible to suppress the occurrence of electrode peeling and burrs. It should be noted that, also in the present eleventh preferred embodiment, a modification of the ninth preferred embodiment may be appropriately applied.

Twelfth Preferred Embodiment

The present twelfth preferred embodiment is a method for manufacturing the semiconductor device (see FIG. 1) and the like according to the first preferred embodiment. That is, the present preferred embodiment is a method for manufacturing a semiconductor device configured so that the first electrode 7*a* and the semiconductor substrate sandwich the second electrode 7*b* in the thickness direction of the semiconductor substrate.

FIG. 33 is a flowchart showing the method for manufacturing the semiconductor device according to the present twelfth preferred embodiment.

First, in steps S61 to S63, steps similar to steps S1 to S3 in FIG. 9 are performed.

In step S64, as shown in FIG. 34, a steel use stainless (SUS) mask 64 for exposing the remainder correspondence region 20*b* in the diode region 20 is formed on the second main surface side.

In step S65, as shown in FIG. 35, first conductivity type impurities are implanted into the second main surface side of the remainder correspondence region 20*b*, and a first conductivity type impurity layer 261 of the first conductivity type is formed.

Figure 36:
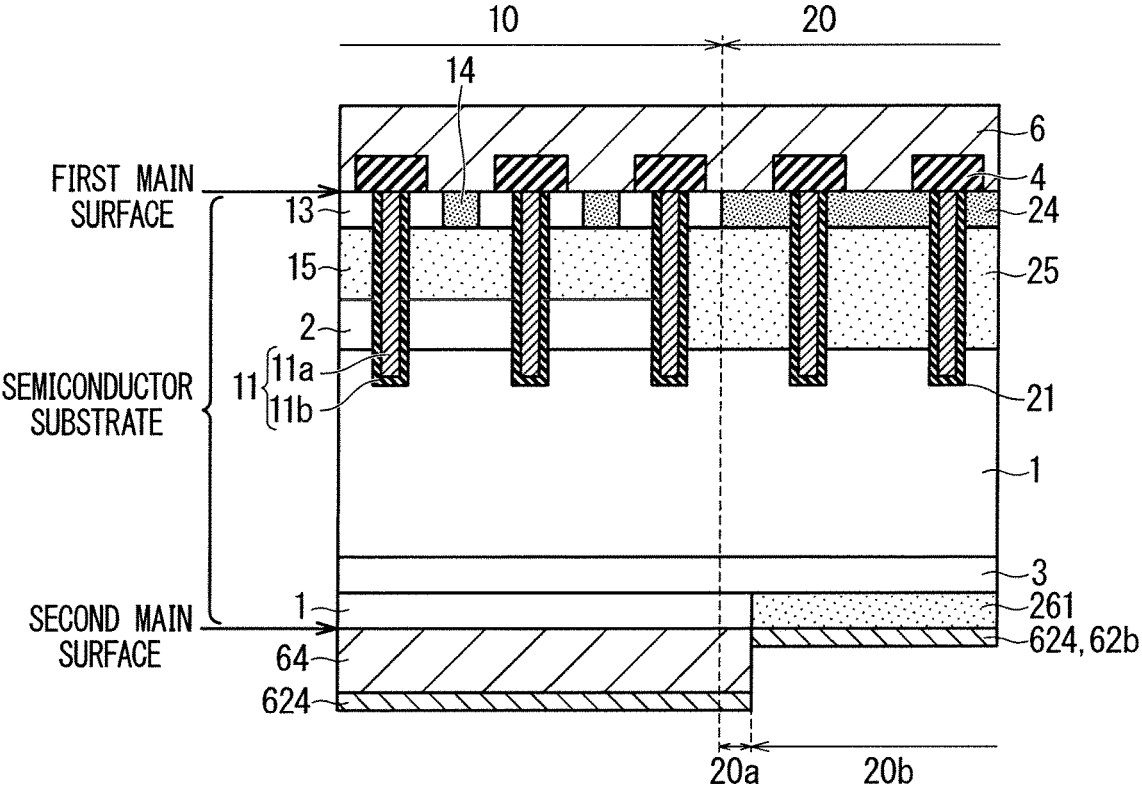

In step S66, as shown in FIG. 36, a conductive film 624, a part of which is connected to the first conductivity type impurity layer 261 and the remainder is connected to the SUS mask 64 is formed. Accordingly, an electrode 62*b* corresponding to the second electrode 7*b* is formed in the remainder correspondence region 20*b*.

Figure 37:
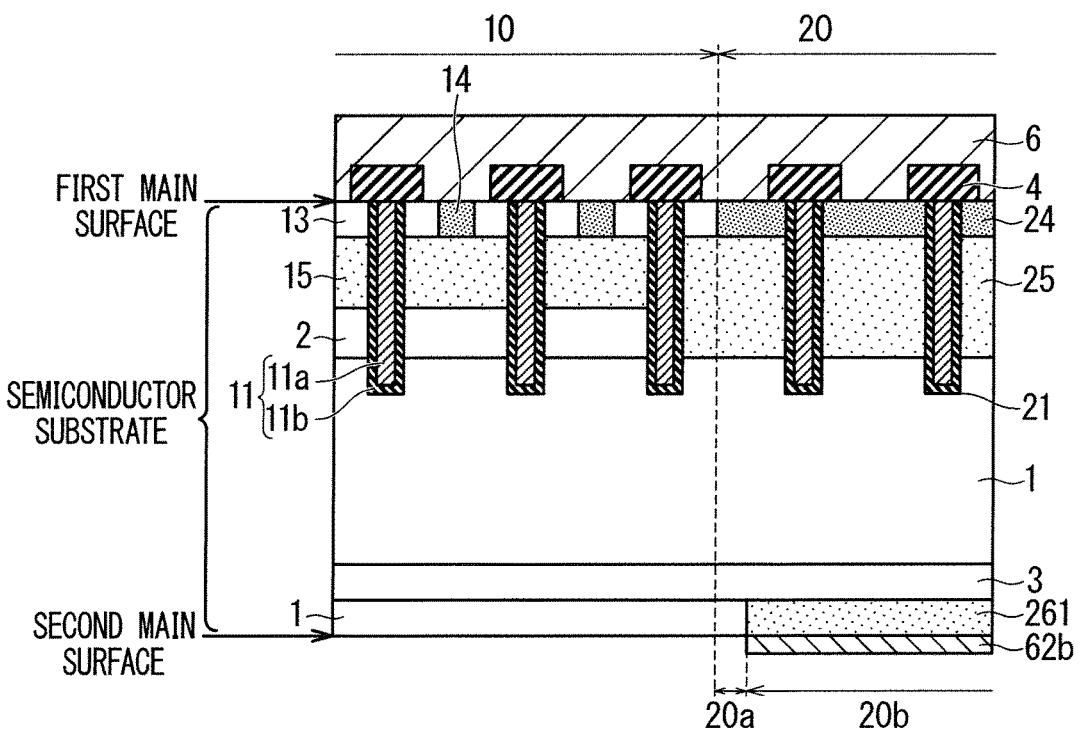

In step S67, as shown in FIG. 37, the SUS mask 64 and the remainder of the conductive film 624 on the SUS mask 64 are removed.

In step S68, as shown in FIG. 38, second conductivity type impurities are implanted into the second main surface side in the IGBT region 10 and the second main surface side in the connection portion correspondence region 20*a* in the diode region 20 at an impurity concentration lower than the impurity concentration of the first conductivity type of the first conductivity type impurity layer 261. In this implantation, the electrode 62*b* is used as a mask. By this implantation, the second conductivity type impurity layer 161 of the second conductivity type is formed on the second main surface side in the IGBT region 10 and the connection portion correspondence region 20*a*.

In step S69, as shown in FIG. 39, annealing is performed for activating the buffer layer 3, the second conductivity type impurity layer 161, and the first conductivity type impurity layer 261. By the annealing, the first conductivity type impurity layer 261 is formed in the second conductivity type impurity layer 161 in the connection portion correspondence region 20*a* in the diode region 20, and the collector layer 16 and the cathode layer 26 are formed.

Figure 40:
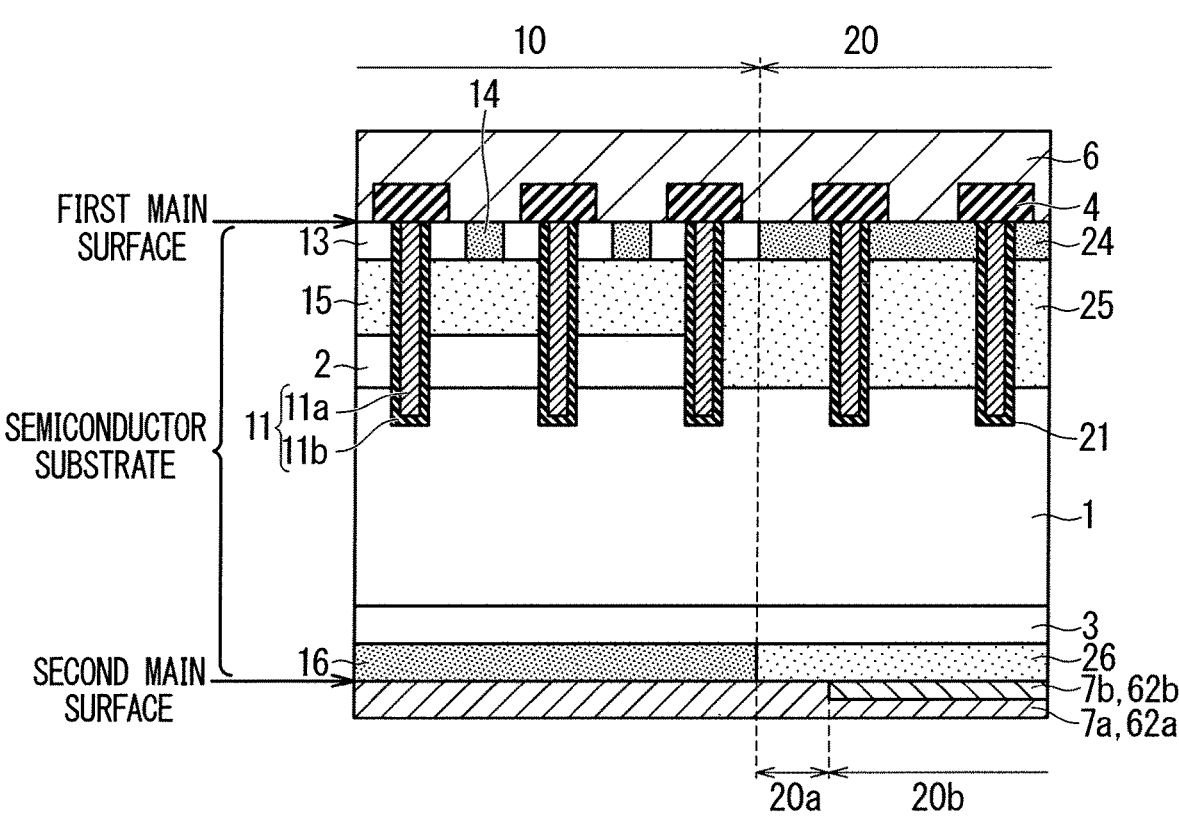

In step S70, as shown in FIG. 40, an electrode 62*a* corresponding to the first electrode 7*a* is formed. Thus, the semiconductor device is completed.

According to the manufacturing method according to the present twelfth preferred embodiment as described above, since the first conductivity type impurity layer 261 to be the cathode layer 26 and the electrode 62*b* to be the second electrode 7*b* can be patterned using one mask, the manufacturing cost can be reduced. It should be noted that, also in the present twelfth preferred embodiment, a modification of the ninth preferred embodiment may be appropriately applied.

Thirteenth Preferred Embodiment

The present thirteenth preferred embodiment is a method for manufacturing the semiconductor device (see FIG. 2) and the like according to the second preferred embodiment. That is, the present preferred embodiment is a method for manufacturing a semiconductor device configured so that the second electrode 7*b* and the semiconductor substrate sandwich the first electrode 7*a* in the thickness direction of the semiconductor substrate.

FIG. 41 is a flowchart showing the method for manufacturing the semiconductor device according to the present thirteenth preferred embodiment.

First, in steps S81 to S83, steps similar to steps S1 to S3 in FIG. 9 are performed.

Figure 42:
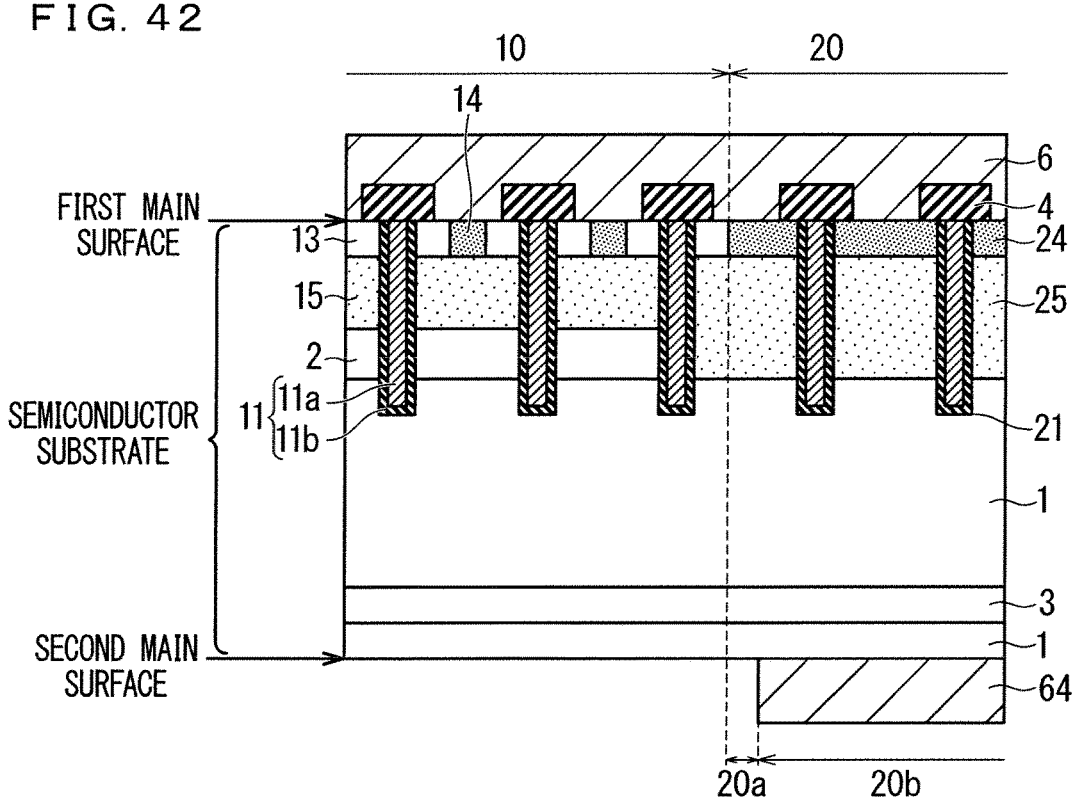

In step S84, as shown in FIG. 42, an SUS mask 64 that exposes the IGBT region 10 and the connection portion correspondence region 20*a* in the diode region 20 is formed on the second main surface side.

Figure 43:
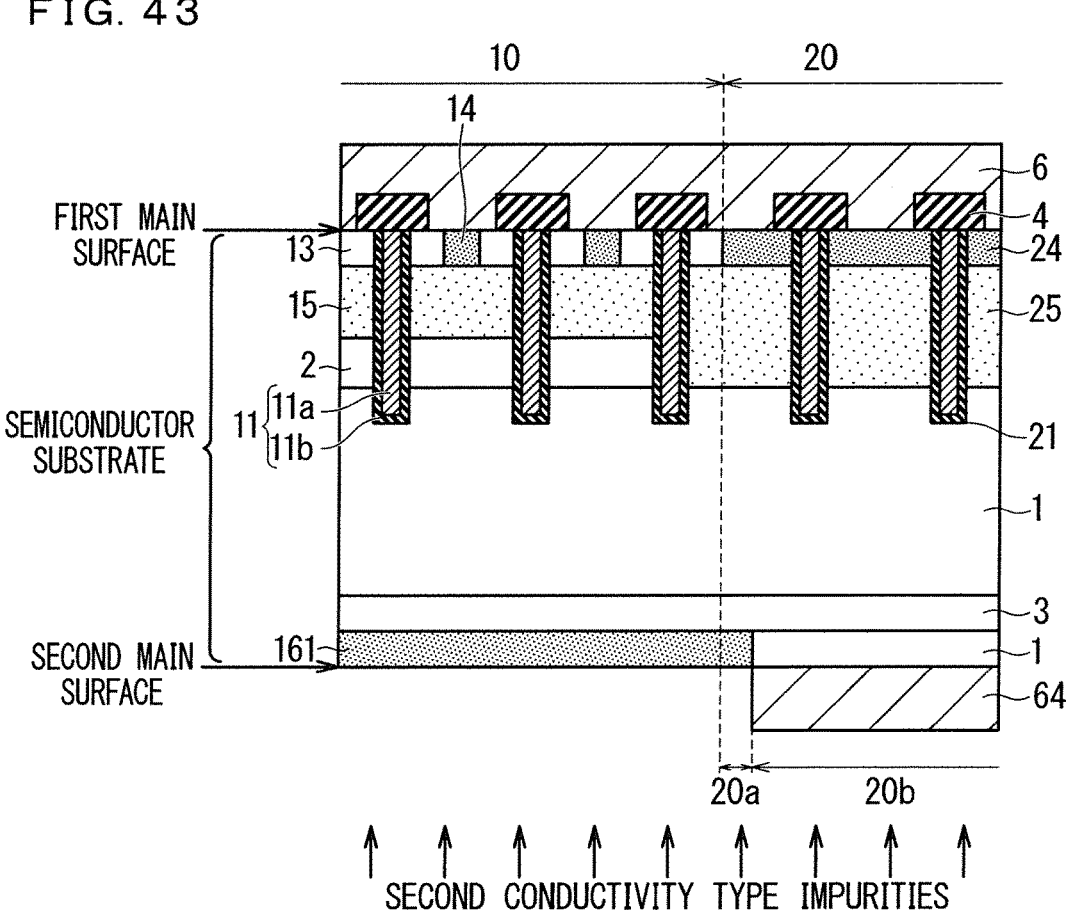

In step S85, as shown in FIG. 43, second conductivity type impurities are implanted into the second main surface side in the IGBT region 10 and the second main surface side in the connection portion correspondence region 20*a*, and the second conductivity type impurity layer 161 of the second conductivity type is formed.

In step S86, as shown in FIG. 44, a conductive film 625, a part of which is connected to the second conductivity type impurity layer 161 and the remainder is connected to the SUS mask 64 is formed. Accordingly, an electrode 62*a* corresponding to the first electrode 7*a* is formed in the IGBT region 10 and the connection portion correspondence region 20*a*.

In step S87, as shown in FIG. 45, the SUS mask 64 and the remainder of the conductive film 625 on the SUS mask 64 are removed.

Figure 46:
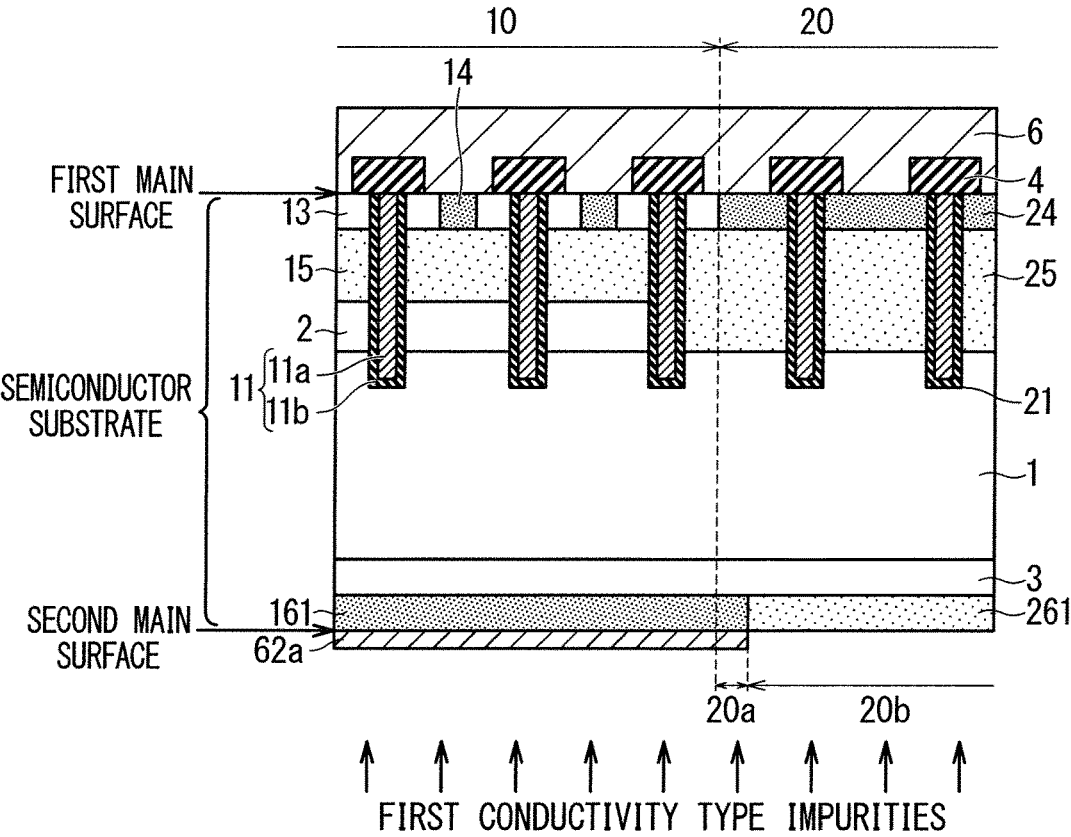

In step S88, as shown in FIG. 46, first conductivity type impurities are implanted into the second main surface side in the remainder correspondence region 20*b* in the diode region 20 at an impurity concentration higher than the impurity concentration of the second conductivity type of the second conductivity type impurity layer 161. In this implantation, the electrode 62*a* is used as a mask. By this implantation, the first conductivity type impurity layer 261 of the first conductivity type is formed on the second main surface side in the remainder correspondence region 20*b* .

Figure 47:
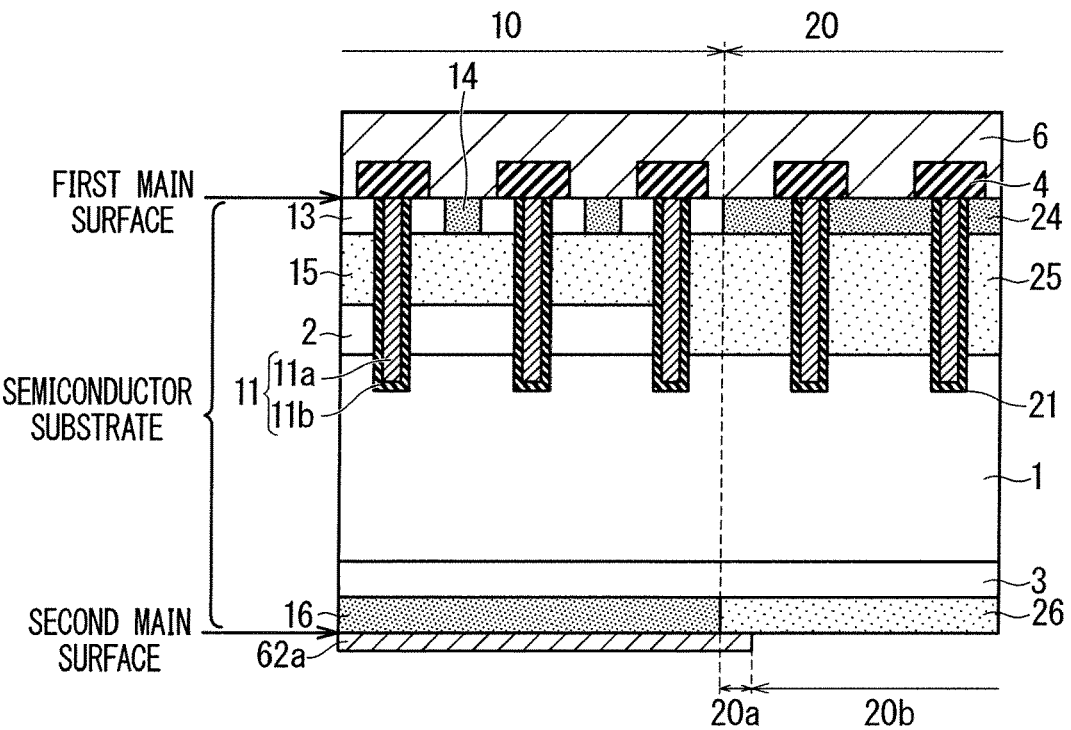

In step S89, as shown in FIG. 47, annealing is performed for activating the buffer layer 3, the second conductivity type impurity layer 161, and the first conductivity type impurity layer 261. By the annealing, the first conductivity type impurity layer 261 is formed in the second conductivity type impurity layer 161 in the connection portion correspondence region 20*a* in the diode region 20, and the collector layer 16 and the cathode layer 26 are formed.

Figure 48:
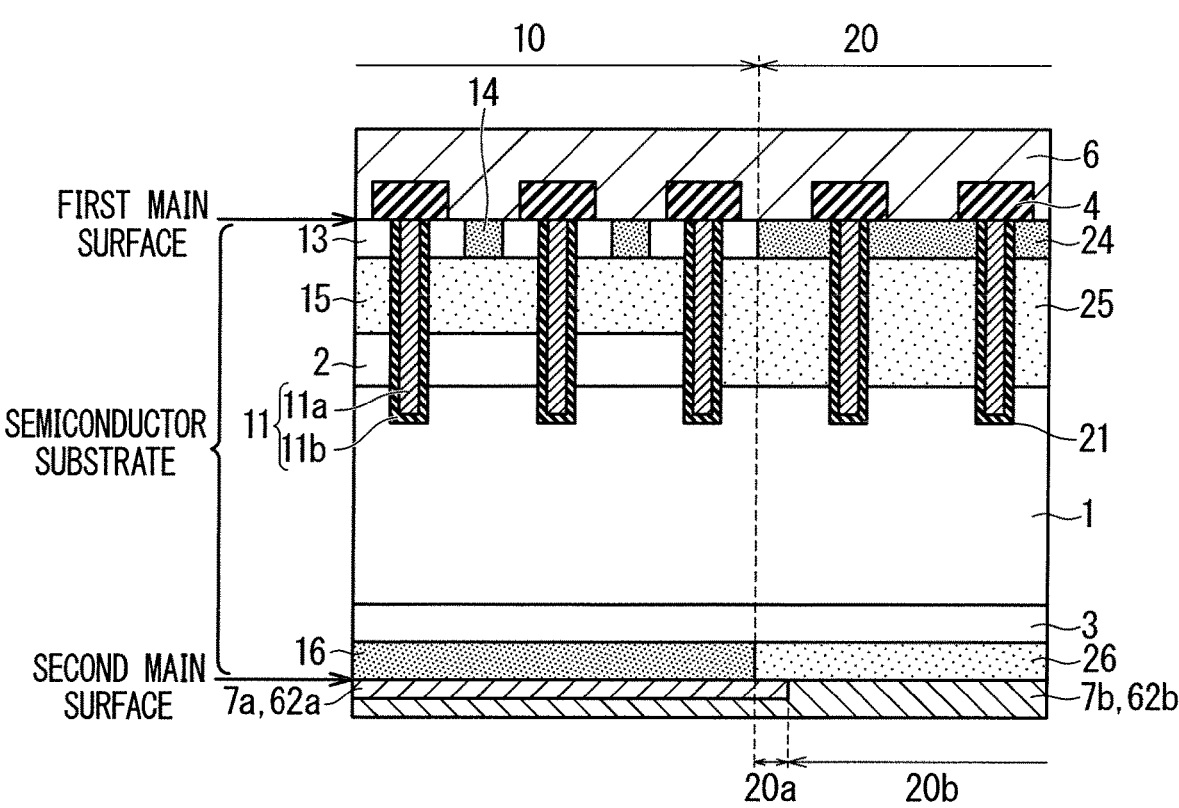

In step S90, as shown in FIG. 48, an electrode 62*b* corresponding to the second electrode 7*b* is formed. Thus, the semiconductor device is completed.

According to the manufacturing method according to the present thirteenth preferred embodiment as described above, since the second conductivity type impurity layer 161 to be the collector layer 16 and the electrode 62*a* to be the first electrode 7*a* can be patterned using one mask, the manufacturing cost can be reduced. It should be noted that, also in the present thirteenth preferred embodiment, a modification of the ninth preferred embodiment may be appropriately applied.

Others

Various modifications can be made to the preferred embodiments described above. For example, the material of the semiconductor substrate may be normal silicon (Si) or a wide band gap semiconductor such as silicon carbide (SiC), gallium nitride (GaN), or diamond. When the material of the semiconductor substrate is a wide band gap semiconductor, stable operation under high temperature and high voltage, and higher switching speed can be achieved.

In addition, for example, the semiconductor substrate is not limited to any one of a withstand voltage class, a floating zone (FZ) substrate, a magnetic-field applied CZochralki (MCZ) substrate, and an epitaxial substrate. A combination of a plurality of preferred embodiments is also possible, and a part of another preferred embodiment can be applied to a part of a certain preferred embodiment.

It should be noted that each of the preferred embodiments and each of the modifications can be freely combined, and each of the preferred embodiments and each of the modifications can be appropriately modified or omitted.

While the disclosure has been shown and described in detail, the foregoing description is in all aspects illustrative and not restrictive. It is therefore understood that numerous modifications and variations can be devised.

What is claimed is:

1. A semiconductor device comprising:
   a semiconductor substrate having a first main surface and a second main surface opposite to the first main surface in a thickness direction of the semiconductor substrate, in which an IGBT region and a diode region are defined;
   an emitter layer of a first conductivity type provided on a first main surface side being a side of the first main surface in the IGBT region;
   a collector layer of a second conductivity type provided on a second main surface side being a side of the second main surface in the IGBT region;
   an anode layer of the second conductivity type provided on the first main surface side in the diode region;
   a cathode layer of the first conductivity type provided on the second main surface side in the diode region;
   a first electrode connected to the collector layer and a first portion on a side of the collector layer in the cathode layer, wherein a portion of the first electrode that contacts the first portion is positioned directly below the cathode layer in the thickness direction of the semiconductor substrate; and
   a second electrode connected to a second portion of the cathode layer that is different from the first portion,
   wherein a work function of the first electrode is larger than a work function of the second electrode,
   one of the first electrode and the second electrode and the semiconductor substrate sandwich another of the first electrode and the second electrode in the thickness direction of the semiconductor substrate, and
   the first electrode is spaced from the second portion.

2. The semiconductor device according to claim 1, wherein the second electrode includes a protruding portion which protrudes along the first electrode and sandwiches the first electrode between the second electrode and the semiconductor substrate.

3. A method for manufacturing the semiconductor device according to claim 1, the method comprising:
   forming a second conductivity type impurity layer of the second conductivity type on the second main surface side in the IGBT region and the diode region;
   forming a conductive film connected to the second conductivity type impurity layer in the IGBT region and the diode region;
   forming a resist for exposing a second portion correspondence region corresponding to the second portion in the diode region;
   removing the conductive film in the second portion correspondence region to form an electrode corresponding to the first electrode;
   forming, in the second conductivity type impurity layer in the second portion correspondence region, a first conductivity type impurity layer of the first conductivity type in which an impurity concentration of the first conductivity type is higher than an impurity concentration of the second conductivity type of the second conductivity type impurity layer;
   removing the resist;
   forming an electrode corresponding to the second electrode; and
   forming the collector layer and the cathode layer by performing annealing for forming the first conductivity type impurity layer, on the second conductivity type impurity layer in a first portion correspondence region corresponding to the first portion in the diode region,
   wherein the second electrode and the semiconductor substrate sandwich the first electrode in the thickness direction.

4. A method for manufacturing the semiconductor device according to claim 1, the method comprising:
   forming, on the second main surface side, a SUS mask for exposing the IGBT region and a first portion correspondence region corresponding to the first portion in the diode region;
   forming a second conductivity type impurity layer of the second conductivity type, on the second main surface side in the IGBT region and on the second main surface side in the first portion correspondence region;
   forming an electrode corresponding to the first electrode by forming a conductive film, a part of which is connected to the second conductivity type impurity layer;
   removing the SUS mask and remainder of the conductive film;
   forming a first conductivity type impurity layer of the first conductivity type in which an impurity concentration of the first conductivity type is higher than an impurity concentration of the second conductivity type of the second conductivity type impurity layer, on the second main surface side in a second portion correspondence region corresponding to the second portion in the diode region;
   forming the collector layer and the cathode layer by performing annealing for forming the first conductivity type impurity layer, on the second conductivity type impurity layer in the first portion correspondence region in the diode region; and
   forming an electrode corresponding to the second electrode,
   wherein the second electrode and the semiconductor substrate sandwich the first electrode in the thickness direction.

5. The semiconductor device according to claim 1, wherein the first electrode directly contacts the collector layer and the first portion.

6. The semiconductor device according to claim 1, wherein the first electrode is directly connected to the collector layer and the first portion, and the second electrode is directly connected to the second portion.

7. The semiconductor device according to claim 1, wherein the work function of the first electrode at least at a position directly below the first portion is larger than the work function of the second electrode at least at a position directly below the second portion.

8. The semiconductor device according to claim 1, wherein the first electrode is spaced from the second portion by way of the second electrode.

9. The semiconductor device according to claim 1, wherein the second electrode directly contacts the second portion.

10. A semiconductor device comprising:

a semiconductor substrate having a first main surface and a second main surface opposite to the first main surface in a thickness direction of the semiconductor substrate, in which an IGBT region and a diode region are defined;

an emitter layer of a first conductivity type provided on a first main surface side being a side of the first main surface in the IGBT region;

18 a collector layer of a second conductivity type provided on a second main surface side being a side of the second main surface in the IGBT region;

an anode layer of the second conductivity type provided on the first main surface side in the diode region;

a cathode layer of the first conductivity type provided on the second main surface side in the diode region;

a first electrode connected to the collector layer and a first portion on a side of the collector layer in the cathode layer, wherein a portion of the first electrode that contacts the first portion is positioned directly below the cathode layer in the thickness direction of the semiconductor substrate; and a second electrode connected to a second portion of the cathode layer that is different from the first portion, wherein a work function of the first electrode is larger than a work function of the second electrode, one of the first electrode and the second electrode and the semiconductor substrate sandwich another of the first electrode and the second electrode in the thickness direction of the semiconductor substrate, and the first electrode is directly connected to the collector layer and the first portion, and the second electrode is directly connected to the second portion.

* * * * *